US011670862B1

(12) United States Patent
Gao et al.

(10) Patent No.: US 11,670,862 B1
(45) Date of Patent: Jun. 6, 2023

(54) TWO-DIMENSIONAL SCALABLE RADIATOR ARRAY

(71) Applicant: City University of Hong Kong, Kowloon (HK)

(72) Inventors: Liang Gao, Kowloon Tong (HK); Chi Hou Chan, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 17/828,237

(22) Filed: May 31, 2022

(51) Int. Cl.
*H01Q 13/18* (2006.01)
*H03B 5/18* (2006.01)
*H01Q 13/16* (2006.01)

(52) U.S. Cl.
CPC ............. *H01Q 13/18* (2013.01); *H01Q 13/16* (2013.01)

(58) Field of Classification Search
CPC .......... H01Q 21/00; H01Q 21/22; H01Q 3/36; H01Q 13/16; H01Q 13/18; H03B 5/12; H03B 5/18; H04B 1/04; H04B 7/06
See application file for complete search history.

(56) References Cited

U.S. PATENT DOCUMENTS 4,951,006 A * 8/1990 Cohen .................... H03B 9/141 331/96
5,650,793 A * 7/1997 Park ..................... H01Q 21/005 333/116
6,275,118 B1* 8/2001 Saito .................... H03B 5/1841 331/177 V
9,344,308 B2 5/2016 Han et al.
9,413,074 B2* 8/2016 Enders ............... H01Q 21/0087
10,587,223 B2 3/2020 Han et al.
10,601,140 B2* 3/2020 Baik ......................... H03F 3/19
10,998,855 B2 5/2021 Momeni et al.
11,258,405 B2* 2/2022 Tousi .................... H04L 49/101
11,588,240 B2* 2/2023 Afzal .................... H03L 7/0802
2005/0184818 A1* 8/2005 Aikawa ................ H03B 5/1894 331/107 SL

OTHER PUBLICATIONS

X. Yi et al., "Emerging terahertz integrated systems in silicon," IEEE Trans. Circuits Syst. I, Reg. Papers, vol. 68, No. 9, pp. 3537-3550, Sep. 2021.
P. Hillger, J. Grzyb, R. Jain, and U. R. Pfeiffer, "Terahertz imaging and sensing applications with silicon-based technologies," IEEE Trans. THz Sci. Technol., vol. 9, No. 1, pp. 1-19, Jan. 2019.

(Continued)

*Primary Examiner* — Tho G Phan
(74) *Attorney, Agent, or Firm* — Renner Kenner Greive Bobak Taylor & Weber

(57) ABSTRACT

A device for signal generation including a unit cell. The unit cell contains two oscillators that are coupled in phase. Each oscillator operates at a fundamental frequency. Each oscillator further includes a slot structure, and the slot structures serve as, at a third harmonic of the fundamental frequency, a slot antenna radiating a third harmonic power. If the device contains multiple unit cell, then each unit cell is horizontally coupled out-of-phase and vertically in-phase with adjacent cells at the fundamental frequency in the device. Therefore, coherent radiation and power combining are achieved at the third harmonic.

11 Claims, 15 Drawing Sheets

(56) References Cited

OTHER PUBLICATIONS

C. Wang, B. Perkins, Z. Wang, and R. Han, "Molecular detection for unconcentrated gas with PPM sensitivity using 220-to-320-GHz dual-frequency-comb spectrometer in CMOS," IEEE Trans. Biomed. Circuits Syst., vol. 12, No. 3, pp. 709-721, Jun. 2018.
C. Wang et al., "Chip-scale molecular clock," IEEE J. Solid-State Circuits, vol. 54, No. 4, pp. 914-926, Apr. 2019.
X. Yi, C. Wang, X. Chen, J. Wang, J. Grajal and R. Han, "A 220-to-320-GHz FMCW radar in 65-nm CMOS using a frequency-comb architecture," IEEE J. Solid-State Circuits, vol. 56, No. 2, pp. 327-339, Feb. 2021.
D. Simic, K. Guo and P. Reynaert, "A 0.42 THz coherent TX-RX system achieving 10dBm EIRP and 27dB NF in 40nm CMOS for phase-contrast imaging," in IEEE Int. Solid-State Circuits Conf. (ISSCC) Dig. Tech. Papers, San Francisco, CA, USA, Feb. 2021, pp. 318-320.
H. Saeidi, S. Venkatesh, X. Lu and K. Sengupta, "THz prism: One-shot simultaneous multi-node angular localization using spectrum-to-space mapping with 360-to-400GHz broadband transceiver and dual-port integrated leaky-wave antennas," in IEEE Int. Solid-State Circuits Conf. (ISSCC) Dig. Tech. Papers, San Francisco, CA, USA, Feb. 2021, pp. 314-316.
S. Lee et al., "An 80-Gb/s 300-GHz-band single-chip CMOS transceiver," IEEE J. Solid-State Circuits, vol. 54, No. 12, pp. 3577-3588, Dec. 2019.
Z. Ahmad, M. Lee, and K. K. O, "1.4 THz, -13 dBm-EIRP frequency multiplier chain using symmetric- and asymmetric-DV varactors in 65 nm CMOS," in IEEE Int. Solid-State Circuits Conf. (ISSCC) Dig. Tech. Papers, San Francisco, CA, USA, Jan./Feb. 2016, pp. 350-351.
H. Aghasi, A. Cathelin, and E. Afshari, "A 0.92-THz SiGe power radiator based on a nonlinear theory for harmonic generation," IEEE J. Solid-State Circuits, vol. 52, No. 2, pp. 406-422, Feb. 2017.
K. Guo, A. Standaert, and P. Reynaert, "A 525-556-GHz radiating source with a dielectric lens antenna in 28-nm CMOS," IEEE Trans. Terahertz Sci. Technol., vol. 8, No. 3, pp. 340-349, May 2018.
B. Khamaisi, S. Jameson, and E. Socher, "0.61 THz radiating source with on-chip antenna on 65 nm CMOS," in Proc. 11th Eur. Microw. Integr. Circuits Conf., London, U.K., Oct. 2016, pp. 389-392.
J. R. Pfeiffer et al., "A 0.53 THz reconfigurable source module with up to 1 mW radiated power for diffuse illumination n terahertz imaging applications," IEEE J. Solid-State Circuits, vol. 49, No. 12, pp. 2938-2950, Dec. 2014.
R. Jain et al., "A 64-pixel 0.42-THz source SoC with spatial modulation diversity for computational imaging," IEEE J. Solid-State Circuits, vol. 55, No. 12, pp. 3281-3293, Dec. 2020.
G. Guimaraes and P. Reynaert, "A 670-GHz 4x2 oscillator-radiator Array Achieving 7.4-dBm EIRP in 40-nm CMOS," IEEE J. Solid-State Circuits, vol. 56, No. 11, pp. 3399-3411, Nov. 2021.
K. Guo and P. Reynaert, "A 0.59THz beam-steerable coherent radiator array with 1mW radiated power and 24.1dBm EIRP in 40nm CMOS," in IEEE Int. Solid-State Circuits Conf. (ISSCC) Dig. Tech. Papers, San Francisco, CA, USA, Feb. 2020, pp. 442-444.
Y. Zhao et al., "A 0.54-0.55 THz 2×4 coherent source array with EIRP of 24.4 dBm in 65nm CMOS technology," in IEEE MTT-S Int. Microw. Symp. Dig., Phoenix, AZ, USA, May 2015, pp. 1-3.
H. Jalili and O. Momeni, "A 0.46-THz 25-element scalable and wideband radiator array with optimized lens integration in 65-nm CMOS," IEEE J. Solid-State Circuits, vol. 55, No. 9, pp. 2387-2400, Sep. 2020.
L. Gao and C. H. Chan, "A 0.45-THz 2-D scalable radiator array with 28.2-dBm EIRP using an elliptical Teflon lens," IEEE J. Solid-State Circuits, vol. 57, No. 2, pp. 400-412, Feb. 2022.
H. Saeidi, S. Venkatesh, C. R. Chappidi, T. Sharma, C. Zhu, and K. Sengupta, "A 4×4 distributed multi-layer oscillator network for harmonic injection and THz beamforming with 14dBm EIRP at 416GHz in a lens less 65nm CMOS IC," in IEEE Int. Solid-State Circuits Conf. (ISSCC) Dig. Tech. Papers, San Francisco, CA, USA, Feb. 2020, pp. 256-258.
Y. Tousi and E. Afshari, "A high-power and scalable 2-D phased array for terahertz CMOS integrated systems," IEEE J. Solid-State Circuits, vol. 50, No. 2, pp. 597-609, Feb. 2015.
N. Buadana, S. Jameson, and E. Socher, "A multiport chip-scale dielectric resonator antenna for CMOS THz transmitters," IEEE Trans. Microw. Theory Techn., vol. 68, No. 9, pp. 3621-3632, Sep. 2020.
Z. Hu, M. Kaynak, and R. Han, "High-power radiation at 1 THz in silicon: A fully scalable array using a multi-functional radiating mesh structure," IEEE J. Solid-State Circuits, vol. 53, No. 5, pp. 1313-1327, May 2018.
H. Jalili and O. Momeni, "A 0.34-THz wideband wide-angle 2-D steering phased array in 0.13-μm SiGe BiCMOS," IEEE J Solid-State Circuits, vol. 54, No. 9, pp. 2449-2461, Sep. 2019.
H. Jalili and O. Momeni, "A standing-wave architecture for scalable and wideband millimeter-wave and terahertz coherent radiator arrays," IEEE Trans. Microw Theory Techn., vol. 66, No. 3, pp. 1597-1609, Mar. 2018.
R. Han et al., "A SiGe terahertz heterodyne imaging transmitter with 3.3 mW radiated power and fully-integrated phase-locked loop," IEEE J. Solid-State Circuits, vol. 50, No. 12, pp. 2935-2947, Dec. 2015.
L. Gao, H. Zhou, K. M. Shum and C. H. Chan, "A 482-GHz 2-D scalable and wideband radiator array," IEEE Microw. Nirel. Compon Lett., vol. 31, No. 9, pp. 1090-1093, Sep. 2021.
R. Han and E. Afshari, "A CMOS high-power broadband 260-GHz radiator array for spectroscopy," IEEE J. Solid-State Circuits, vol. 48, No. 12, pp. 3090-3104, Dec. 2013.
H. Wang, J. Chen, J. T. S. Do, H. Rashtian, and X. Liu, "High-efficiency millimeter-wave single-ended and differential fundamental oscillators in CMOS," IEEE J. Solid-State Circuits, vol. 53, No. 8, pp. 2151-2163, Aug. 2018.
J. Chen, H. Wang, and X. Liu, "A 310-GHz fundamental oscillator with 0.4-mW output power and 3.2% dc-to-RF efficiency in 65-nm CMOS," in Proc. IEEE 20th Wireless Microw. Technol. Conf. (WAMICON), Apr. 2019, pp. 1-4.
R. Kananizadeh and O. Momeni, "High-power and high-efficiency millimeter-wave harmonic oscillator design, exploiting harmonic positive feedback in CMOS," IEEE Trans. Microw. Theory Techn, vol. 65, No. 10, pp. 3922-3936, Oct. 2017.
D. S. Wang, B. J. Chen and C. H. Chan, "High-selectivity bandpass frequency-selective surface in terahertz band," IEEE Trans. THz Sci. Technol., vol. 6, No. 2, pp. 284-291, Mar. 2016.

* cited by examiner

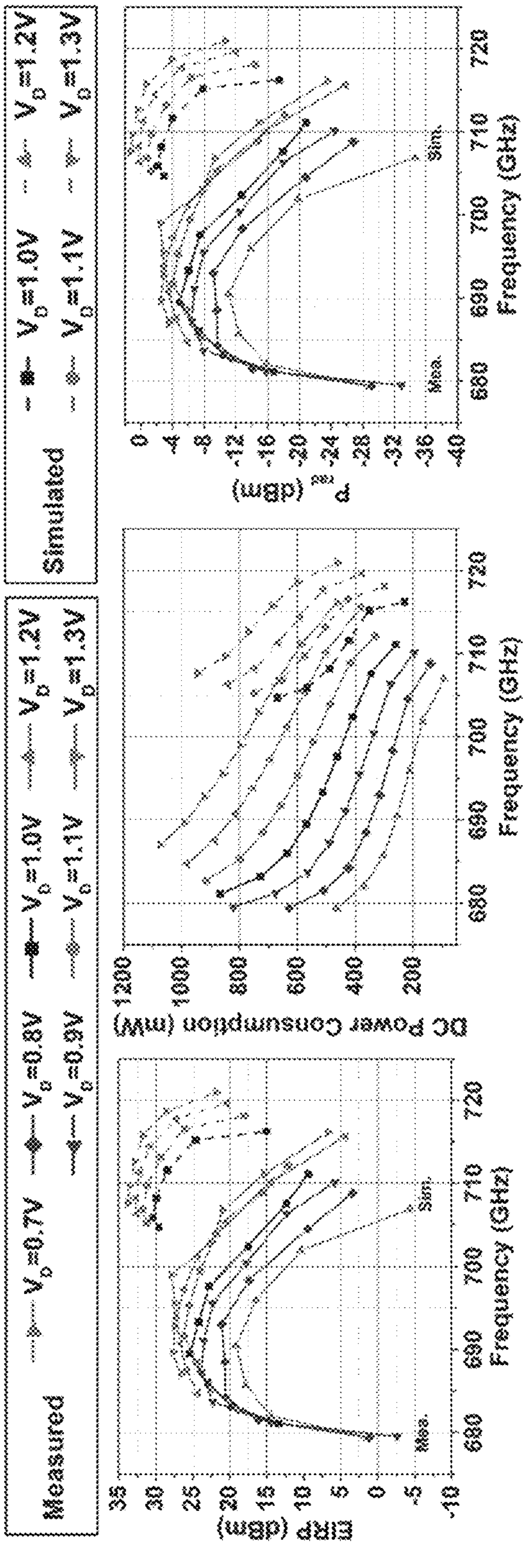
Fig. 19a
Fig. 19b
Fig. 19c
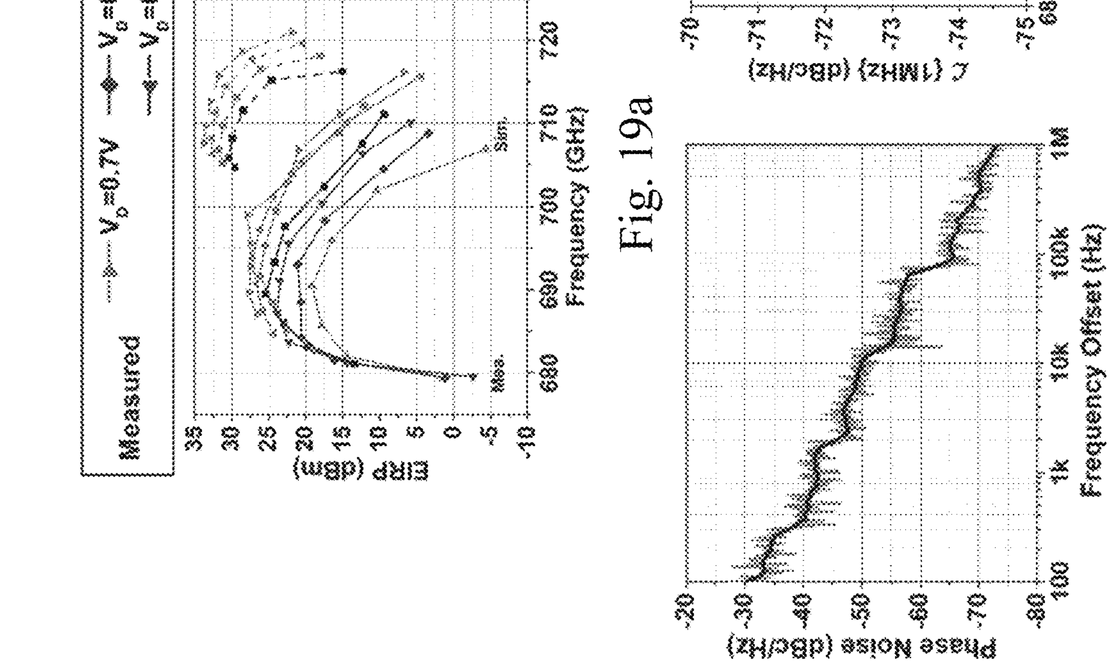
Fig. 20a
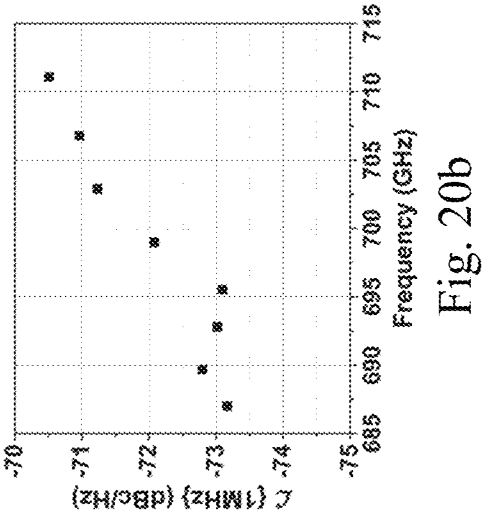
Fig. 20b
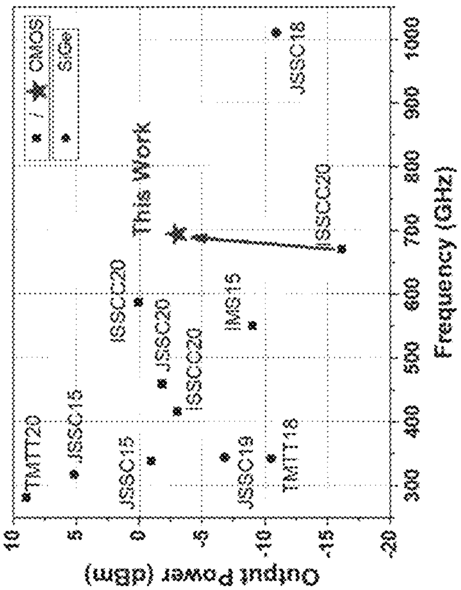
Fig. 21

TWO-DIMENSIONAL SCALABLE RADIATOR ARRAY

FIELD OF INVENTION

This invention relates to signal generating devices, for example coupled harmonic oscillator-radiator arrays operating as a Terahertz (THz) source.

BACKGROUND OF INVENTION

Terahertz technology is an emerging and growing field with a potential for developing applications varying from passenger scanning at an airport to large digital data transfers, and has been reflecting significant advancements on the scientific front. The THz band will play an important role in the future 6G for more than 100 Gbps data rate data transmission. For terahertz applications like high-speed wireless data transmission, spectroscopy, imaging, and radar, a high-power terahertz source is indispensable. These sources implemented by integrated circuit technology will be of small form factor and low cost.

At THz frequencies (0.3 THz to 3 THz), the chip size is comparable to a wavelength so that the antenna and circuits can be integrated on a single chip, enabling fully-integrated THz on-chip systems. THz applications like spectroscopy for gas sensing, accurate timekeeping, FMCW (Frequency-Modulated Continuous Wave) radar, imaging, angular localization, and high-speed wireless data transmission have been successfully demonstrated in silicon-based technology. However, even with the utilization of harmonic power, the operation frequencies of most THz chips are still below 400 GHz. The reason is that silicon-based technology's maximum oscillation frequency $f_{max}$ (~300 GHz in CMOS) limits the output power level at higher frequencies using conventional architecture.

Conventional multiplier-chain-based radiators can provide phase-locked THz signals at frequencies beyond 600 GHz. However, they require high RF input power above 100 GHz, which is difficult to obtain, yet the radiated power is very small. For example, −22.7 dBm at 1.33 THz and −17.3 dBm at 0.93 THz have been reported. Therefore, the total efficiency for the multiplier-chain-based radiator is very low. A more efficient THz radiator is based on the free-running oscillator, which directly converts DC power to THz radiation. The output power of a single radiator is limited, and simply adding more radiators can improve the total radiated power, but the output signals are incoherent. In contrast, the coupled oscillator architecture effectively enhances the radiated power coherently by spatial power combining. Each oscillator sustains oscillation at the fundamental frequency and synchronizes with other oscillators properly. Therefore, the harmonic signals from the oscillators radiate in-phase and combine in space to form a directive beam. However, most of these scalable radiators are limited to frequencies below 600 GHz. Because oscillator-based radiators above 600 GHz require high fundamental oscillation frequency to maximum oscillation frequency ($f_{osc}/f_{max}$) ratio and high-order harmonic power extraction and radiation. All of these are very challenging in silicon-based technology.

SUMMARY OF INVENTION

Accordingly, the present invention, in one aspect, is a device for signal generation that contains coupled unit cells. The unit cell includes two oscillators that are coupled in phase, where each oscillator operates at a fundamental frequency. Each oscillator further includes a slot structure. The slot structures serve as, at a third harmonic of the fundamental frequency, a slot antenna radiating a third harmonic power.

In some embodiments, the slot structures are each substantially perpendicular to a virtual boundary line between the two oscillators.

In some embodiments, the oscillators each contains two identical radiating elements separated and connected by the slot structure of the oscillator. The signal generating device further contains four identical radiating elements as such.

In some embodiments, the radiating element contains a transistor; and a meander structure connected to the transistor. The transistor is further connected to the slot structure of the radiating element.

In some embodiments, an end of the meander structure is open-ended.

In some embodiments, the meander structure has a substantially "S" shape.

In some embodiments, a drain of the transistor connects to the slot structure of the radiating element. A source of the transistor connects to the meander structure of the radiating element.

In some embodiments, a gate of the transistor connects to a transmission line of the radiating element that is substantially parallel to a virtual boundary line between the two oscillators of each of the unit cells.

In some embodiments, the signal generating device further includes a plurality of unit cells along each one of two different directions.

In some embodiments, each of the plurality of unit cells is horizontally coupled out-of-phase and vertically in-phase with adjacent cells at the fundamental frequency.

In some embodiments, the signal generating device further contains an elliptical lens attached at a backside of the device.

Embodiments of the invention therefore provide a novel and compact 2-D scalable architecture of coupled harmonic oscillator array for high-power terahertz (THz) radiation. The compact and symmetric scalable unit cell includes at least two differential oscillators with corresponding number of slot antennas radiating the third-harmonic power. Each unit cell is coupled horizontally out-of-phase and vertically in-phase with adjacent cells at the fundamental frequency. Therefore, coherent radiation and power combining are achieved at the third harmonic. The design is implemented using the transmission lines, and therefore it is also easy to apply to SiGe technology and high-speed and high-power III-V semiconductor technology.

As such, the compact and symmetric scalable unit cell is an integration of (i) a novel unit cell with optimized fundamental oscillation at high frequency, (ii) a compact coupling method in both directions without extra components, (iii) a compact embedded slot antenna to extract and radiate the third harmonic, and (iv) an embedded DC supply method enabling larger scalability. Each component has multiple functions to make the design compact. In some embodiments, the coherent radiated THz signals from all the array units are beam-shaped to be highly directive via incorporating an external low-cost elliptical Teflon lens.

Radiator arrays according to embodiments of the invention use low-cost CMOS technology to generate and radiate high-power and high-frequency terahertz signals (e.g., above 600 GHz). For example, the proposed invention can be part of the active terahertz imaging system to illuminate targeted objects. Embodiments of the proposed invention provides scalable coupled oscillator-radiator arrays that can sustain oscillation near $f_{max}$ of a transistor and coherently radiates the third harmonic for high output power. In one example, the present invention provides a 2-D scalable radiator array with high radiated power operating at 700 GHz using TSMC 65-nm CMOS technology, but it is applicable to other frequencies and other IC fabrication technologies. Compared with conventional terahertz microchips, the fabricated 4/4 array prototype has the highest radiated power, radiated per area, EIRP, frequency tuning range, and dc-to-THz efficiency among silicon-based scalable coherent radiator arrays operating beyond 600 GHz. The output power level is comparable to the terahertz sources implemented using III-V technology, but the cost is much lower.

The foregoing summary is neither intended to define the invention of the application, which is measured by the claims, nor is it intended to be limiting as to the scope of the invention in any way.

BRIEF DESCRIPTION OF FIGURES

The foregoing and further features of the present invention will be apparent from the following description of embodiments which are provided by way of example only in connection with the accompanying figures, of which:

FIG. 19*a* shows simulated and measured EIRP of the chip in FIG. 10 with Teflon lens.

FIG. 19*b* shows simulated and measured DC power consumption of the chip in FIG. 10 with Teflon lens.

FIG. 19*c* shows simulated and measured radiated power of the chip in FIG. 10 with Teflon lens.

FIG. 20*a* shows measured phase noise at 694 GHz, for the chip in FIG. 10.

FIG. 20*b* shows measured phase noise at 1-MHz offset from 687 GHz to 711.1 GHz, for the chip in FIG. 10.

FIG. 21 is an overview of the output power of the silicon-based coherent scalable radiators including the chip in FIG. 10 and some conventional radiators.

In the specification and drawings, like numerals indicate like parts throughout the several embodiments described herein.

DETAILED DESCRIPTION

Figure 1A:
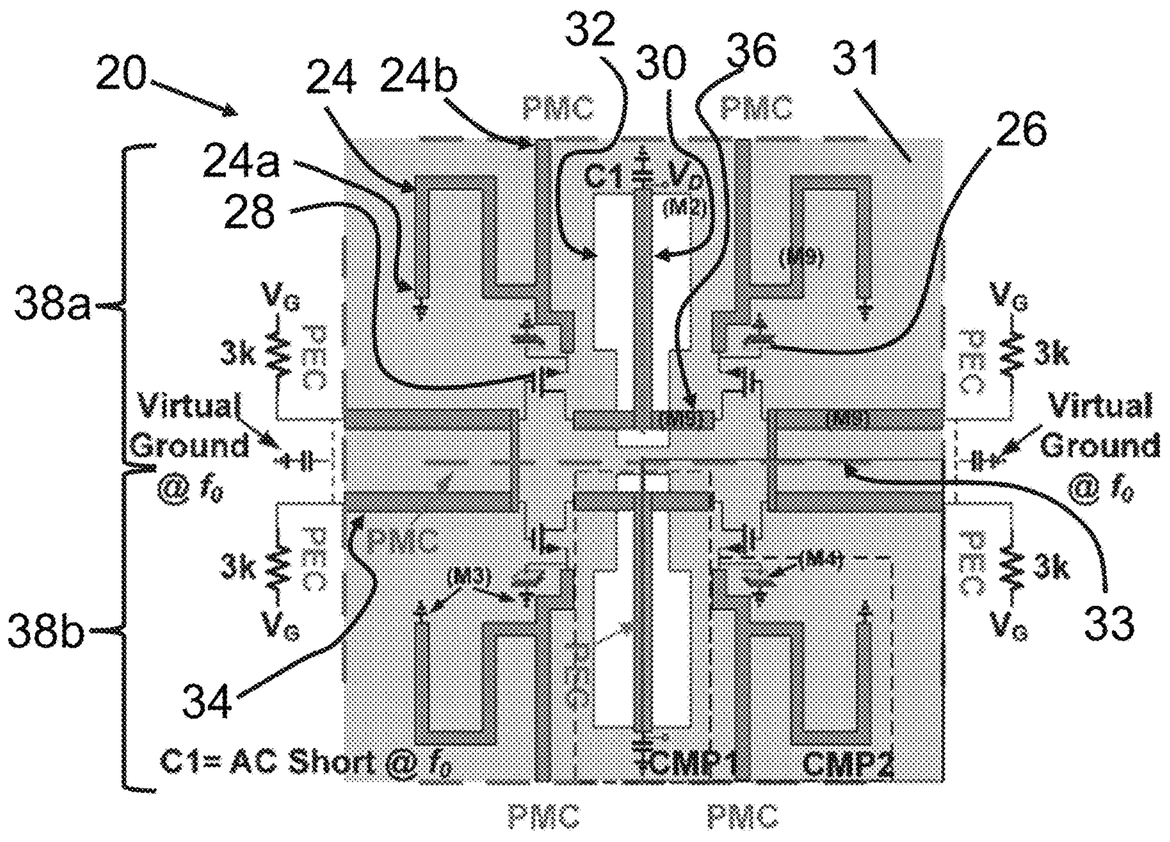
FIG. 1*a* shows the structure of an oscillator-radiator unit cell according to a first embodiment of the invention.

A two-dimensional (2D) scalable radiator array architecture is now described according to an embodiment of the invention, and the radiator array is based on a unit cell 20 of a coupled oscillator-radiator, as shown in FIG. 1*a*. The unit cell 20 is compact and symmetric scalable, and is implemented on a silicon substrate 31. The unit cell 20 contains two differential oscillators 38*a*, 38*b* with a slot antenna in each of the two oscillators 38*a*, 38*b* radiating the third-harmonic power. The unit cell 20 is coupled horizontally out-of-phase and vertically in-phase with adjacent cells (not shown in FIGS. 1*a*-1*c*) in the radiator array at a fundamental frequency $f_0$. Therefore, coherent radiation and power combining are achieved at the third harmonic of $f_0$. As shown in FIG. 1*a*, the two oscillators 38*a*, 38*b* are positioned in a top half and a bottom half of the unit cell 20, respectively, and are coupled symmetrically along the horizontal boundary line 33.

The slot antennas are each implemented by a slot structure (indicated by the box CMP1 in FIG. 1*a*) that consists of a slot 32 formed in the silicon substrate 31, and a slot trace 30 above the slot 32 which is made from metal. The slot 32 has a varying width, and in particular a portion of the slot 32 near the edge of the unit cell 20 has a width larger than that of another portion of the slot 32 near the center of the unit cell 20. The slot trace 30 connects to a drain of a transistor 28 (which is shown as a NMOSFET in FIG. 1*a*) via a drain transmission line 36. The drain transmission line 36 is perpendicular to the slot trace 30 and a single drain transmission line 36 serves two transistors 28 in the unit cell 20, as will be described in more details below.

The unit cell 20 exhibits a two-fold symmetry, which means that it contains four identical radiating elements each being one quarter of the unit cell 20 and occupies one quarter of the area of the unit cell 20. One such radiating element has its equivalent circuit shown in FIG. 1*b*. The two differential oscillators 38*a*, 38*b* each contain two such radiating elements that are configured side-by-side, and the two radiating elements share a same slot structure CMP1. There is a single drain transmission line 36 in each of the two oscillators 38*a*, 38*b*, which forms a "T" shape with the slot trace 30 that connects to the drain transmission line 36. The single drain transmission line 36 then connects to two transistors 28 respectively in two radiating elements, in each of the two oscillators 38*a*, 38*b*. On the other hand, at a free end of the slot trace 30 (i.e., opposite to the drain transmission line 36) there is connected a voltage source $V_D$ implemented on a M2 layer, and the free end is also grounded via a capacitor C1.

In each of the four radiating elements, the transistor 28 connects at its source to a meander structure 24 that has a substantially "S" shape. Between the two open ends of the "S" shape, a first end 24*a* is grounded, and a second end 24*b* reaches an edge of the unit cell 20. In the oscillator 38*a*, the second ends 24*b* in the two radiating elements reach the top boundary of the unit cell 20. In the oscillator 38*b*, the second ends 24*b* in the two radiating elements reach the bottom boundary of the unit cell 20. A portion of the meander structure 24 near the second end 24*b* is parallel to the slot trace 30 in the same oscillator 38*a* or 38*b*, and so is a portion of the structure 24 near the first end 24*a*. The source of the transistor 28 besides being connected to a meander structure 24 is further connected to parallel metal plates 26 (in M4) for oscillation, and then to ground (in M3).

In each of the four radiating elements, the transistor 28 connects at its gate to a gate transmission line 34 which is AC shorted to provide a necessary inductance for the gate of the transistor 28. The other end of the gate transmission line 34 connects to voltage source $V_G$ via a large resistor (e.g. 3K Ohm). As one can see from FIG. 1*a*, the gate transmission line 34 and the drain transmission line 36 in each of the two oscillators 38*a*, 38*b* are located on a same virtual straight line (not shown) that is parallel to the horizontal boundary line 33, and are both perpendicular to the slot trace 30. In addition, corresponding gate transmission lines 34 in the two oscillators 38*a*, 38*b* that are symmetrical about a boundary line 33 between the two oscillators 38*a*, 38*b* are connected near the transistors 28.

It should be noted that all the transmission lines described above in the unit cell 20 are implemented using M9. All the capacitors described above in the unit cell 20 are implemented using a metal plate in M4. As skilled persons understand, M2, M3, M4, and M9 are different metal layers in CMOS technology, and AC stands for alternate current. The layer stack up structure of the 65-nm CMOS technology used in the embodiment, with the different layers formed on a silicon substrate, is shown in FIG. 1*c*. FIG. 1*c* also shows the lumped equivalent circuit of a transistor 28 at $f_0$, where it can be seen that the drain and the gate of the transistor are respectively connected to inductors $L_D$, $L_G$, and the source is connected to a capacitor $C_S$.

Figure 1B:
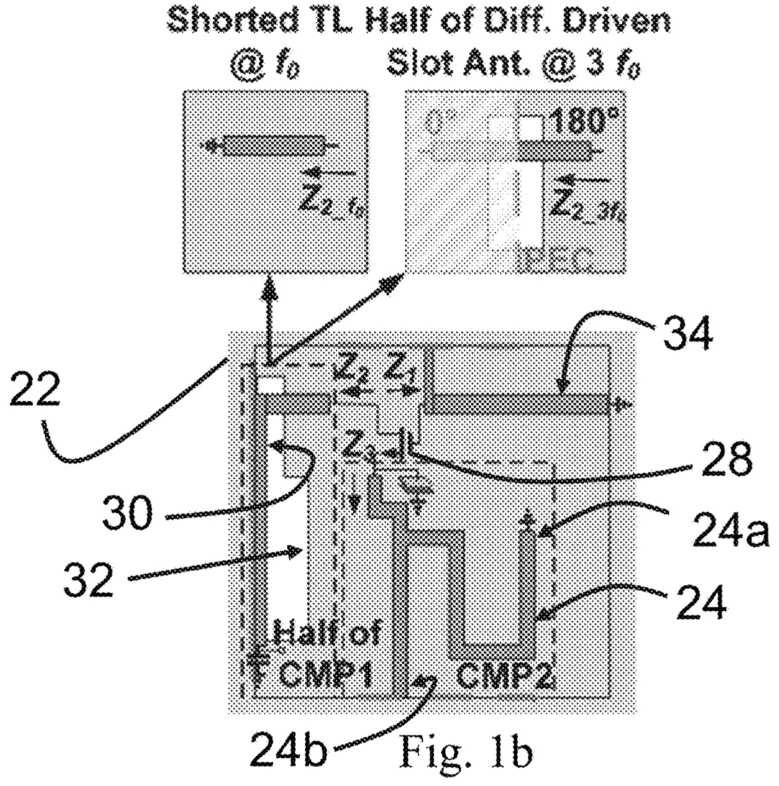
FIG. 1*b* shows the one-quarter equivalent circuit of the unit cell in FIG. 1*a* at odd harmonics.
Figure 1C:
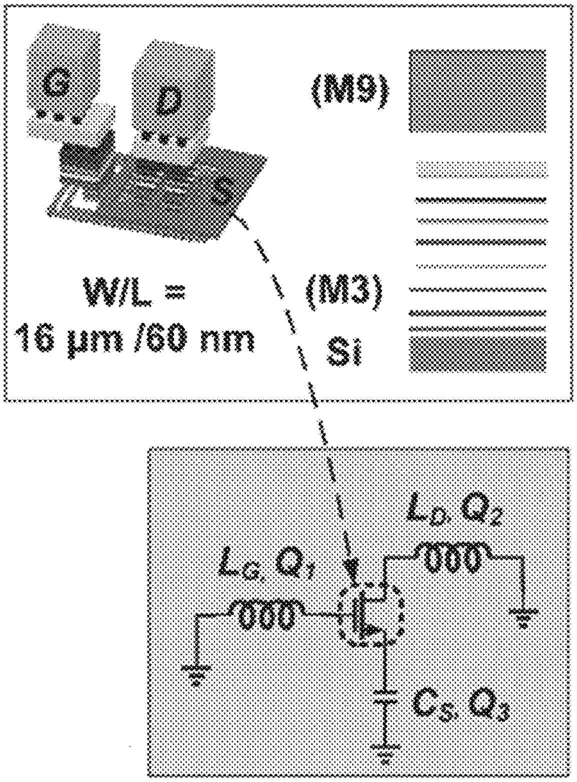
FIG. 1*c* illustrates the transistor layout, layer stack-up and the lumped equivalent circuit in FIG. 1*b* at $f_0$.

Having described the structure of the unit cell 20 in FIGS. 1*a*-1*b* above, the description now goes to working principle of the unit cell 20. The unit cell 20 shown in FIG. 1*a* oscillates at the fundamental frequency $f_0$ (for example 235 GHz in a specific design and simulation) and radiates the third harmonic $3f_0$. The size of the transistor is W/L=16 μm/60 nm. The buck terminal of transistors 28 is connected to the ground through a 3-k resistor, and they are not shown in FIGS. 1*a*-1*c*. The top and bottom boundaries of the unit cell 20 can be treated as equivalent perfect magnetic conductors (PMCs). The left and right boundaries can be treated as equivalent perfect electric conductors (PECs) once the unit cell 20 is correctly coupled with other cells (not shown) in the array. Each unit cell 20 has two symmetry planes, i.e., the PEC and the PMC planes, in the vertical and horizontal directions respectively. The two differential oscillators 38*a*, 38*b* are coupled in phase within the unit cell 20, and the horizontal symmetry plane is then equivalent to a PMC. Similarly, the vertical symmetry plane is equivalent to a PEC for the differential oscillators. The PEC and PMC boundaries are treated as short and open circuits, respectively.

The component values in the unit cell 20 are synthesized at a high fundamental to maximize oscillation frequency ratio $f_{osc/fmax}$ which will be described later. The DC voltage supply function is embedded in the structure of the unit cell 20 itself, as shown in FIG. 1*a*, and after that, the unit cell 20 is suitable for large scalability. In CMP1, the supply voltage $V_D$ to the drain is from the AC short end connected to a large metal plate in M2. The ground plane is implemented using M3 metal layer. Supply voltage and ground planes are closely placed and treated as AC short at $f_0$. A large resistor as mentioned above is connected from the virtual ground point (in the PEC boundary) to provide the gate bias voltage.

Figure 2A:
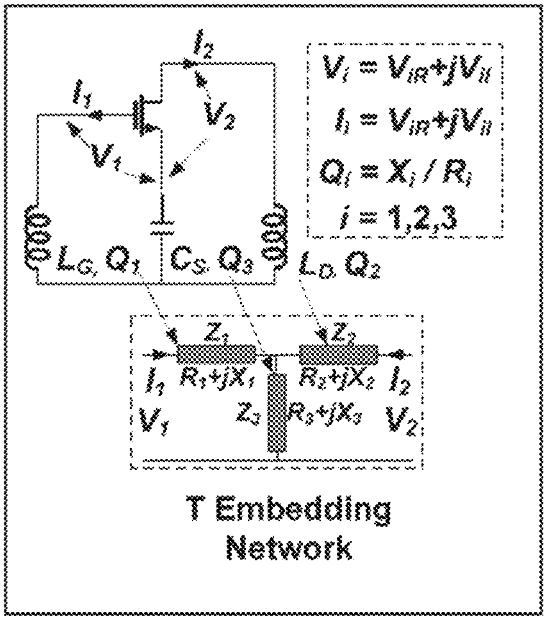
FIG. 2*a* illustrates a general topology to synthesize the oscillator in FIG. 1*c*.

The component values of the oscillator in FIG. 1*c* can be explicitly determined based on the two-port linear network analysis as skilled persons can understand. The passive components in the oscillator can be treated as a T embedding network, as shown in FIG. 2*a*. The inductor and capacitor with a finite quality factor are modeled as a resistor in series with a reactance ($R_i$+j$X_i$), and the quality factor $Q_i$ is defined as $X_i/R_i$ where i is 1, 2, 3. Based on the port AC voltages $V_1$, $V_2$ (@$f_0$), and the port terminal AC currents $I_1$, $I_2$ (@$f_0$) with predetermined $Q_1$ and $Q_3$, the component values can be synthesized using the following equation:

$$\begin{bmatrix} 0 & \frac{I_{1R}}{Q_1} - I_{1I} & 0 & \frac{I_{1R}+I_{2R}}{Q_3} - (I_{1I}+I_{2I}) \\ 0 & \frac{I_{1I}}{Q_1} - I_{1R} & 0 & \frac{I_{1I}+I_{2I}}{Q_3} + (I_{1R}+I_{2R}) \\ I_{2R} & 0 & -I_{2I} & \frac{I_{1R}+I_{2R}}{Q_3} - (I_{1I}+I_{2I}) \\ I_{2I} & 0 & I_{2R} & \frac{I_{1I}+I_{2I}}{Q_3} + (I_{1R}+I_{2R}) \end{bmatrix} \begin{bmatrix} R_2 \\ X_1 \\ X_2 \\ X_3 \end{bmatrix} = \begin{bmatrix} V_{1R} \\ V_{1I} \\ V_{2R} \\ V_{2I} \end{bmatrix}, \quad (1)$$

where the subscripts R and I denote the real and imaginary parts of the voltages $V_i$ and currents $I_i$ (i=1, 2), respectively.

With proper choices of $V_1$, $V_2$, and the quality factor, the calculated result shows that $X_1$ and $X_2$ are positive (inductive) and $X_3$ is negative (capacitive). Therefore, the corresponding inductances and capacitance are easily obtained by $$L_G = \frac{X_1}{2\pi f_0},\ L_D = \frac{X_2}{2\pi f_0},\ C_s = -\frac{1}{2\pi f_0 X_3}.$$

Figure 2B:
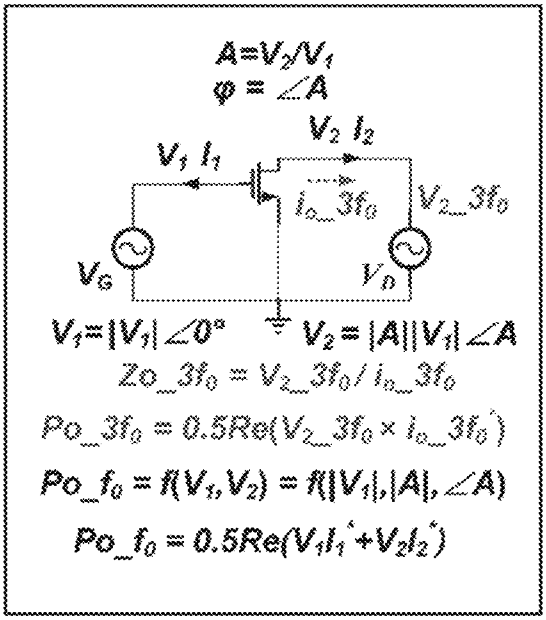
FIG. 2*b* shows the simulation setup for synthesizing the oscillator in FIG. 1*c*.

Various component values can be synthesized to sustain oscillation at $f_0$ based on the choices of port voltages. The port AC voltages $V_1$ and $V_2$ at $f_0$ should be chosen appropriately so that the oscillators 38*a*, 38*b* can sustain and generate the third harmonic current as large as possible. The simulation setup shown in FIG. 2*b* is utilized to find the proper voltages. The voltage sources at the gate and drain of transistors 28 can provide arbitrary DC bias voltages and sinusoidal voltages at different harmonics. The transistors 28 are biased with $V_G$ at the gate terminal and $V_D$ at the drain terminal. Only excitation voltages $V_1$ and $V_2$ at $f_0$ are applied to the gate and drain terminals, respectively. Then, the current responses of the transistor 28 from the gate and drain at $f_0$ are $I_1$ and $I_2$, respectively. The third-harmonic current response from the drain is $I_o\_3f_0$. $Po\_f_0$ is used to evaluate the net output power from the transistor 28 at $f_0$, which can be calculated as shown in FIG. 2*b*. When the excitation voltages $V_1$ and $V_2$ are changed, $Po\_f_0$ should be positive enough so that the output power of the transistor 28 at $f_0$ can compensate for the loss in the embedding network, and higher third-harmonic current $I_o\_3f_0$ output from the drain terminal is preferred.

TABLE I

DIFFERENT DESIGN POINTS AND THE SYNTHESIZED COMPONENT VALUES

| Design Points | #1 | #2 | #3 |
|---|---|---|---|
| $\lvert V_1\rvert$ (V) | 0.9 | 1.05 | 0.9 |
| φ | 160° | 160° | 160° |
| $\lvert A\rvert$ | 1 | 1 | 1.23 |
| $Po\_f_0$ (mW) | 3.02 | 2.07 | 2.09 |
| $\lvert Io\_3f_0\rvert$ (mA) | 3.73 | 6.81 | 6.37 |
| $L_G$ (pH), $Q_1$ | 23.9, 10 | 23.8, 20 | 21.4, 20 |
| $L_D$ (pH), $Q_2$ | 16.4, 10.4 | 16.7, 17.6 | 20.4, 12.5 |
| Cs (fF), $Q_3$ | 22.4, −10 | 19.8, −20 | 18.4, −20 |

Figure 3A:
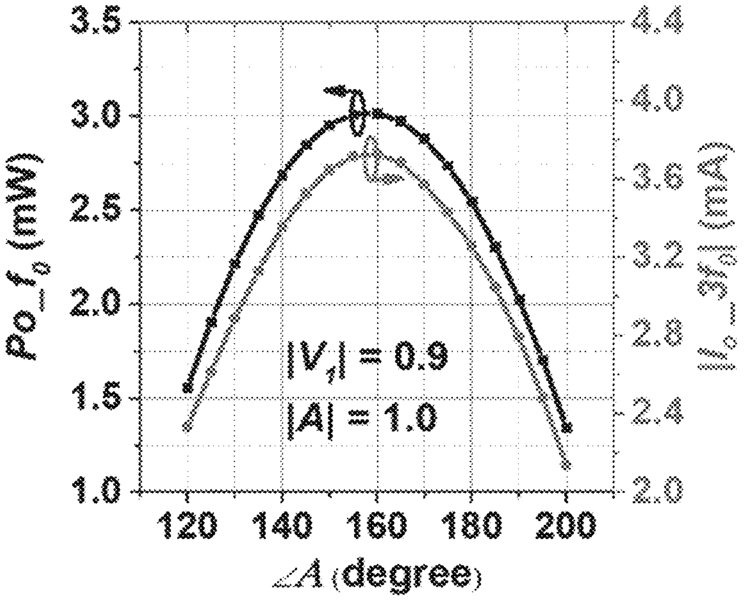
FIG. 3*a* illustrates simulated $Po\_f_0$ and $|I_o\_3f_0|$ with φ varying from 120° to 200° under $|V_1|$=0.9 V, |A|=1, from the setup in FIG. 1*c*.
Figure 3B:
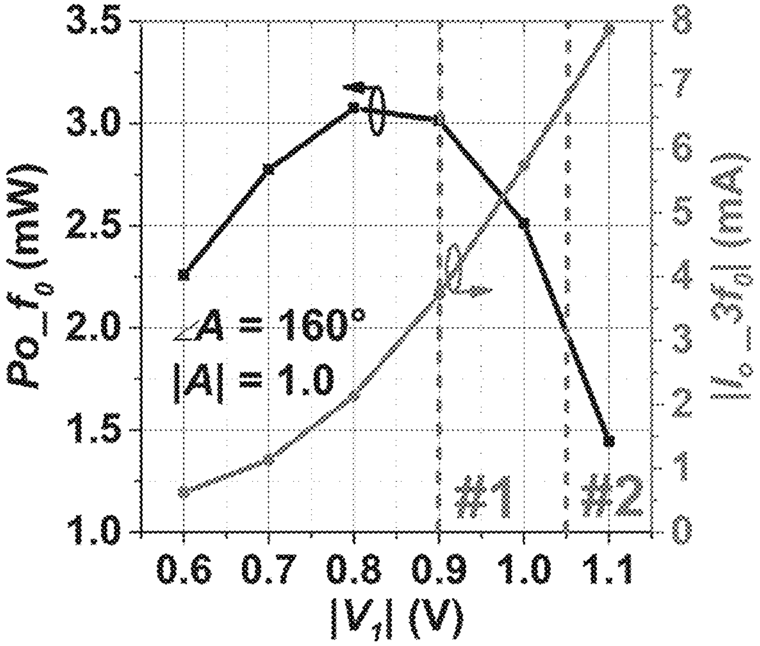
FIG. 3*b* illustrates simulated $Po\_f_0$ and $|I_o\_3f_0|$ with $|V_1|$ varying from 0.6 V to 1.1 V under φ=160°, |A|=1, from the setup in FIG. 1*c*.
Figure 3C:
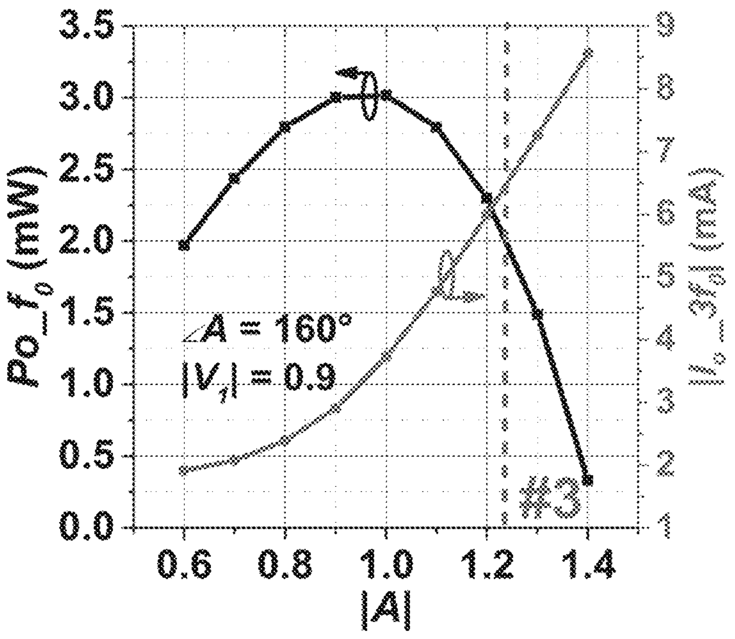
FIG. 3*c* illustrates simulated $P_{add}$ and $|I_o\_3f_0|$ with |A| varying from 0.6 to 1.4 under φ=160°, $|V_I|$=0.9 V. $V_G$=1.0 V, $V_D$=1.3 V, $f_0$=235 GHz, from the setup in FIG. 1*c*.

The transistor 28 is biased under $V_G$=1 V and $V_D$=1.3 V. Define voltage gain $A=V_2/V_1$. The phase (φ) of A is critical for $Po\_f_0$. Therefore, φ is firstly varied from 120° to 200° and keep $\lvert V_1\rvert$=0.9 V and $\lvert A\rvert$=1. The simulated $Po\_f_0$ and $\lvert I_o\_3f_0\rvert$ are shown in FIG. 3*a*, and both peak at ~160°. FIG. 3*b* shows the simulated $Po\_f_0$ and $\lvert I_o\_3f_0\rvert$ by changing $\lvert V_1\rvert$ from 0.6 V to 1.1 V with φ=160° and $\lvert A\rvert$=1. It can be observed that a maximum $Po\_f_0$ can be achieved at $\lvert V_1\rvert$=0.8 V, but as $V_1$ further increases, $Po\_f_0$ will decrease drastically. The magnitude of A is then varied, and keep φ=160° and $\lvert V_1\rvert$=0.9 V. The maximum $Po\_f_0$ is achieved at $\lvert A\rvert$=1, and further increase of $\lvert A\rvert$ will reduce $Po\_f_0$ quickly. $\lvert I_o\_3f_0\rvert$ monotonously increases as $\lvert V_1\rvert$ or $\lvert A\rvert$ increases, as shown in FIGS. 3*b* and 3*c*. As $\lvert V_1\rvert$ or $\lvert A\rvert$ (or $\lvert V_2\rvert$) increases, the transistor will enter a deeper triode region, more current will be converted to the third harmonic current, and the fundamental current will be reduced. Therefore, $Po\_f_0$ will decrease quickly for high $\lvert V_1\rvert$ or $\lvert A\rvert$. The net fundamental output power $Po\_f_0$ will determine the quality factor of the components in the embedding network, and lower quality-factor components require a higher $Po\_f_0$. If the quality factors of the passive components are high enough, high $\lvert V_1\rvert$ and $\lvert V_2\rvert$ can be maintained in the synthesized oscillator so that a larger third harmonic current $\lvert I_o\_3f_0\rvert$ can be generated. For example, three design points #1, #2, and #3 are chosen, as labeled in FIGS. 3(*b*) and 3(*c*), and then synthesize the corresponding component values using (1). The results are summarized in Table I above.

Comparing the design points #1 and #2 in FIG. 3*b*, the phase and amplitude of A are kept the same except for $\lvert V_1\rvert$. For design point #2, $\lvert V_1\rvert$ is higher, resulting in higher $\lvert I_o\_3f_0\rvert$ but smaller $Po\_f_0$. Therefore, the quality factors of the synthesized component are larger, as shown in Table I. It can also be found that the synthesized component values are quite similar for design points #1 and #2, which make sense because the phase and amplitude of A mainly determine the synthesized component values. It also implies that once the oscillator is designed, the final operation state is determined by the quality factor of the components. In this design, the implemented component values are based on the calculated values at design point #1, but the implemented component quality factors are higher than the calculated values, then the oscillation amplitude will increase and approach design point #2. Design point #3 in FIG. 3*c* is chosen so that $Po\_f_0$ is close to design point #2. As $\lvert A\rvert$ is higher for design point #3, the synthesized component values have a more obvious difference, as shown in Table 1. It can also be found that $\lvert I_o\_3f_0\rvert$ is slightly smaller than design point #2, which indicates $\lvert A\rvert$=1 is slightly preferred.

The structures of all components in the unit cell 20 are shown in FIGS. 1*a*-1*c*. The structure mainly utilizes the microstrip lines to implement the calculated ideal component values. The dimensions of these components are optimized and determined using the EM simulation tool ANSYS HFSS. The dimensions of the transmission line at the gate terminal are easily determined based on the one-quarter equivalent circuit in FIG. 1*b*. Apart from providing the required inductance, it is also used for out-of-phase coupling in each row and in-phase coupling inside the unit cell. The structure connected to the source terminal (which is indicated in FIG. 1*a* by the box CMP2) also has multiple functions, making the design compact. It can be used for providing the required capacitance (parallel metal plate in M4) for oscillation, DC path to the ground, and in-phase coupling with adjacent vertical cells.

The slot structure CMP1, which is connected to the drain terminals, has dual functions, as shown in FIG. 1*b*. It is a differentially driven transmission line at $f_0$ and used for sustaining out-of-phase oscillation. At $3f_0$, it also serves as a differentially driven slot antenna to radiate the harmonic signal into free space. The feed line is close to the end of the slot antenna to minimize the radiation impedance at $f_0$ so that the radiation loss at $f_0$ can be reduced. The silicon substrate thickness is chosen to be 339 μm in this exemplary implementation to reduce the wave reflection between the Si-air boundary. In addition, the metal trace (which is the slot trace 30) above the slot 32 is on the PEC boundary and therefore is used for DC current supply without affecting the differential oscillation. The slot trace 30 above the slot 32 will also make CMP1 exhibit large input impedance under in-phase excitation, useful to suppress the in-phase mode. The in-phase second-harmonic signals cannot radiate from CMP1 because the E-field distribution in CMP1 under in-phase excitation is similar to a coplanar waveguide, and the fields will cancel each other in the far-field region. The input impedance of CMP1 under differential mode at $f_0$ ($Z_2\_f_0$) can be easily tuned to satisfy the calculated inductance. However, at $3f_0$, the input impedance of the half differentially driven slot antenna $Z_2\_3f_0$ is hard to be tuned to maximize the radiated third harmonic power because of the limited design space, which will be illustrated in the following sections.

As explained, apart from the optimum phase of the voltage gain A, the high oscillation amplitudes are preferred for large third-harmonic current, but they are limited by the low-quality factor passive components at the designed frequency. To convert the current into more output power, the third-harmonic load impedance should be properly chosen as follows.

Figure 4A:
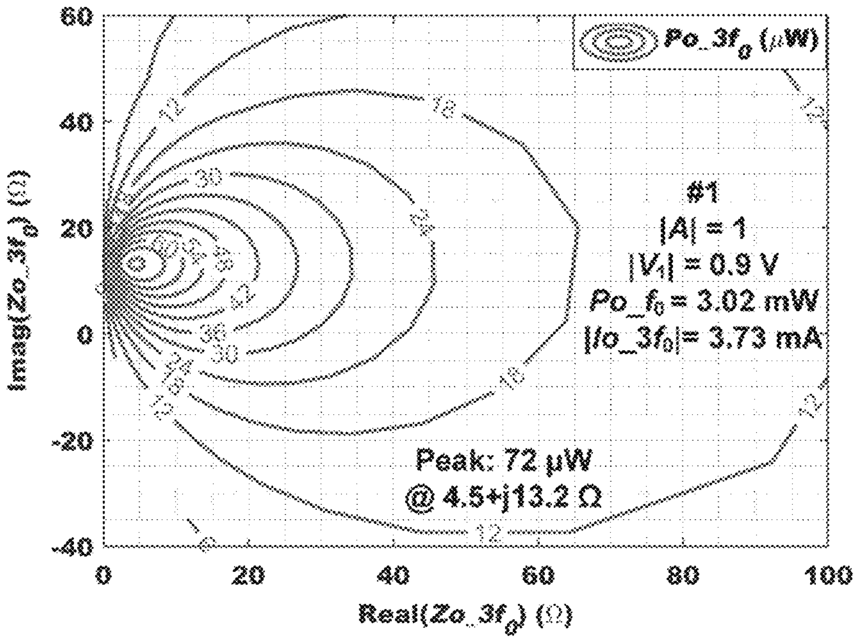
FIG. 4*a* shows the contour map of $Po\_3f_0$ at design point #1 under different $Zo\_3f_0$ with 6-μW step, peak $Po\_3f_0$ of 72 μW is achieved under 4.53+j13.24Ω, from the setup in FIG. 1*c*.
Figure 4B:
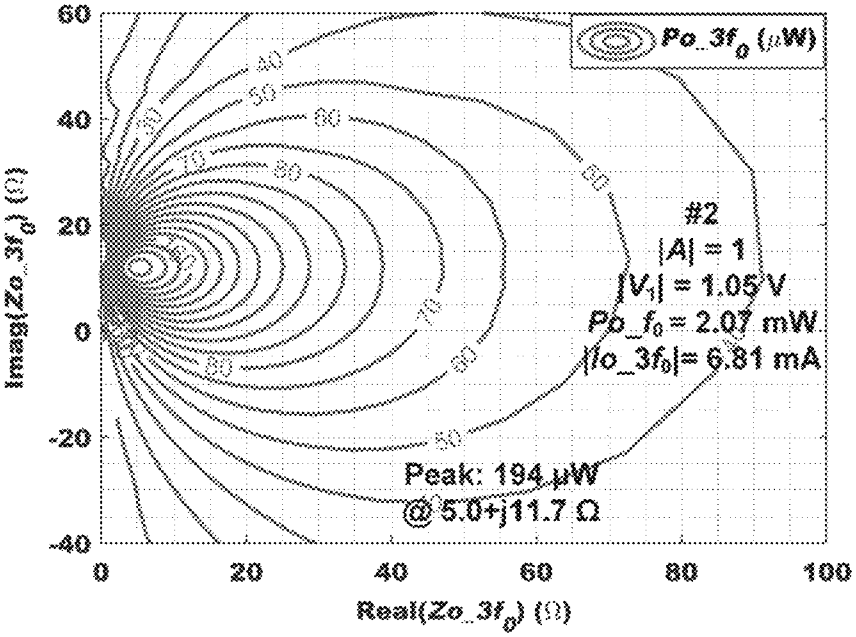
FIG. 4*b* shows the contour map of $Po\_3f_0$ at design point #2 under different $Zo\_3f_0$ with 10-μW step, peak $Po\_3f_0$ of 194 μW is achieved under 5.0+j11.7Ω, from the setup in FIG. 1*c*.
Figure 4C:
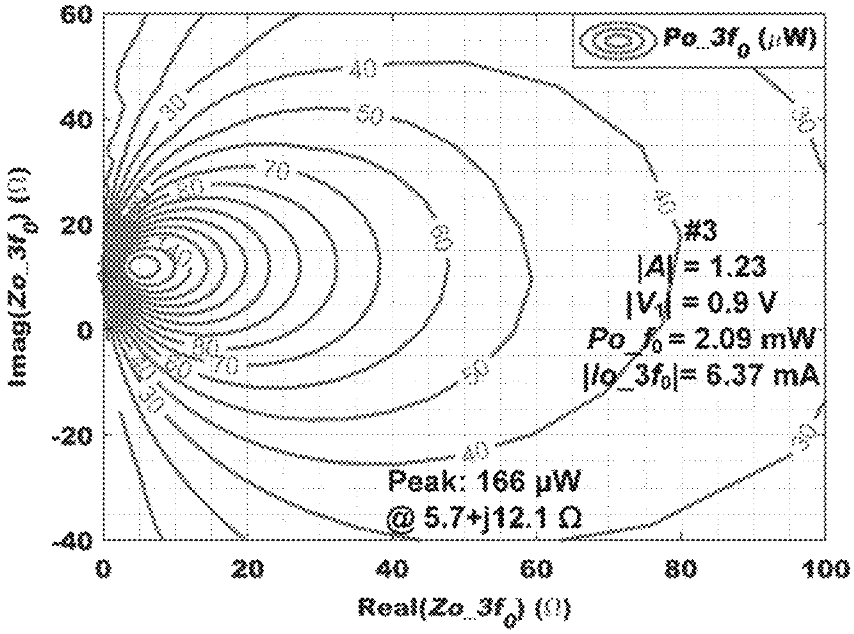
FIG. 4*c* shows the contour map of $Po\_3f_0$ at design point #3 under different $Zo\_3f_0$ with 10-μW step, peak $Po\_3f_0$ of 166 μW is achieved under 5.7+j12.1Ω, from the setup in FIG. 1*c*.

The simulation setup in FIG. 2*b* can also be used to find the optimum third-harmonic load impedance. Bias voltage $V_G$ cis 1.0 V, and supply voltage $V_D$ is 1.3 V. A third-harmonic voltage $V_2\_3f_0$ is further superimposed on the drain, varying the amplitude and phase of $V_2\_3f_0$, and the current response $I_o\_3f_0$ from the drain terminal will also change. Therefore, varying $V_2\_3f_0$ is equivalent to changing the third harmonic load impedance $Zo\_3f_0$, which can be calculated as shown in FIG. 2*b*. At the same time, the third-harmonic output power $Po\_3f_0$ will change, and it can also be calculated using the formula in FIG. 2*b*. Therefore, the output third-harmonic power $Po\_3f_0$ under different $Zo\_3f_0$ can be plotted in a contour map as shown in FIGS. 4*a*, 4*b* and 4*c*, which represent $Po\_3f_0$ at design points #1, #2 , #3, respectively. For design points #1 and #2, the amplitude of the voltage gain A is the same, and the output power difference in FIGS. 4*a* and 4*b* directly reflects the impact of the quality factor of the components on the harmonic output power. If the oscillator is designed based on $|A|=1$, the result will approach FIG. 4*a* once the actual component quality factors are low or vice versa, the output harmonic power will close to FIG. 4*b*. As for design points #2 and #3, the fundamental output power $Po\_f_0$ is similar, but the peak third-harmonic output power $Po\_3f_0$ for $|A|=1$ is higher than the case of $|A|=1.23$, as shown in FIGS. 4*b* and 4*c*. By observing these figures, one can also find out that the optimum impedances for peak $Po\_3f_0$ are similar for the three design points.

Figure 5:
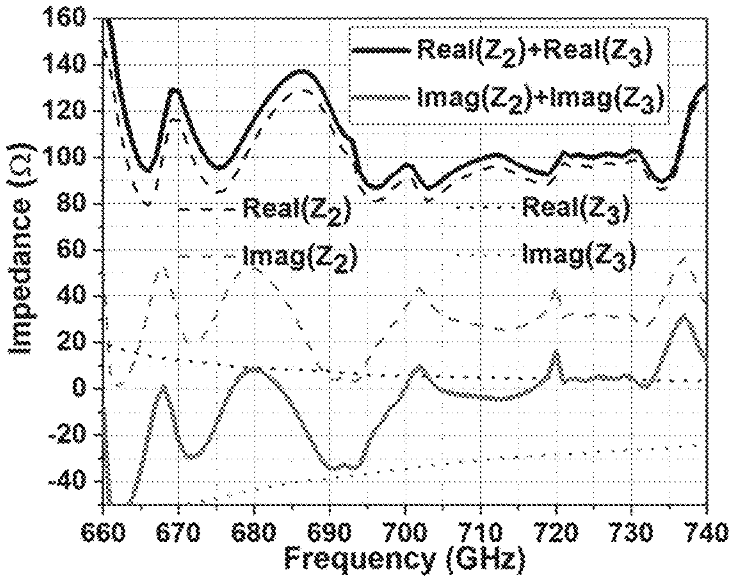
FIG. 5 illustrates the input impedances of $Z_2$ and $Z_3$ and their summation in the third-harmonic frequency band, in the radiating element shown in FIG. 1*b*.

Once the optimum impedance is determined, the input impedance of the antenna should be tuned to match the impedance. However, this is difficult to achieve, and is one of the trade-offs in this design. As explained, the multi-functional CMP1 has to serve as the coupling structure and provide the required inductance for the fundamental oscillation. The inductance is small. Therefore, the width of CMP1 is also small. Moreover, in the vertical direction, two oscillators 38*a*, 38*b* are incorporated within the unit cell 20, reducing the length of CMP1. Finally, no more design space can be used for impedance matching, and the energy is directly fed to the antenna at $3f_0$. FIG. 5 shows the input impedance of $Z_2$ and $Z_3$ and their sum ($Zo\_3f_0$) at the third harmonic frequencies. The real part of the differentially driven slot antenna's input impedance is quite large. It makes $Zo\_3f_0$ away from the optimum value for maximum output power. For the implemented oscillator unit cell, the simulated $Po\_3f_0$ from one transistor is ~40 μW, which matches the result in FIG. 5(*b*). Even though the transistor drain is not well matched at $3f_0$ by directly connecting the antenna, the loss in the matching network is avoided, and the final output power degradation is not that severe.

Figure 6:
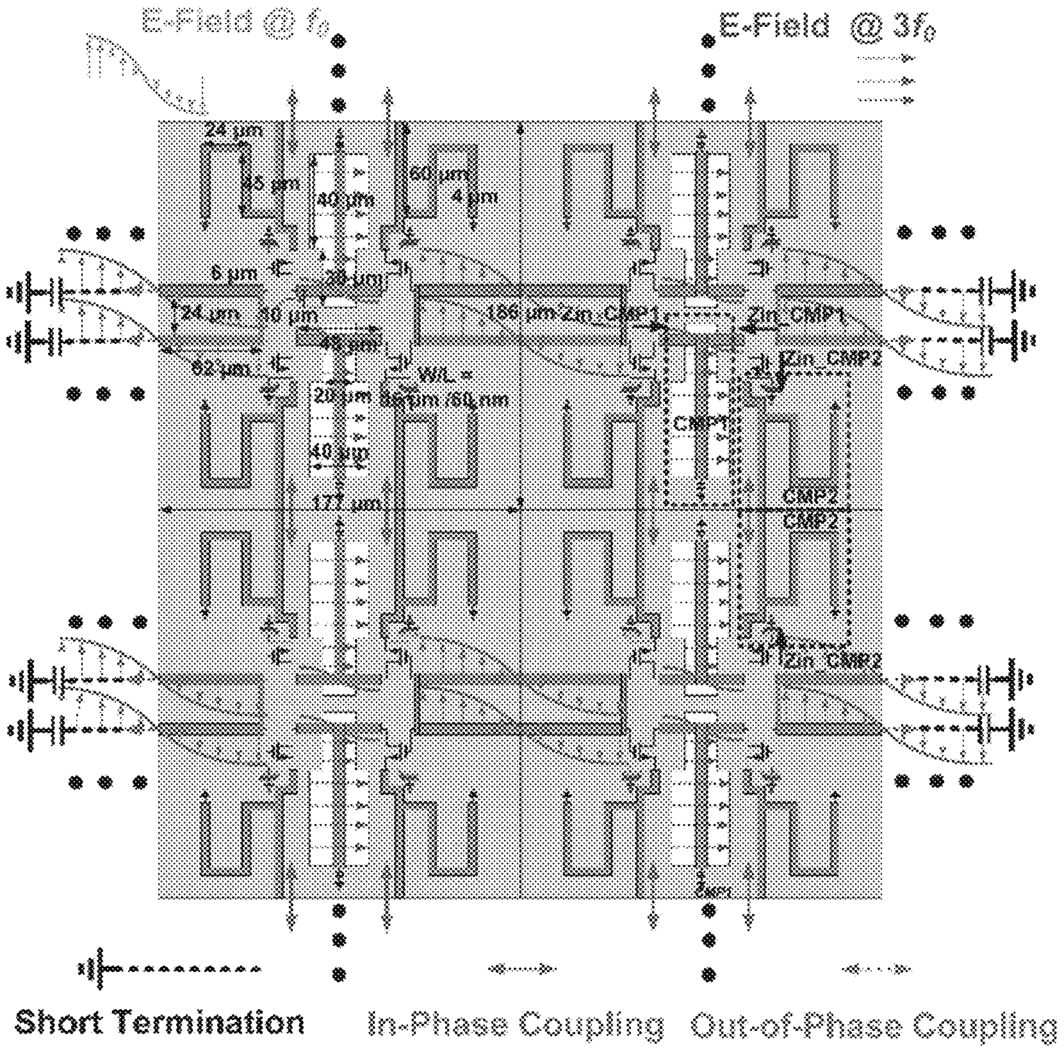
FIG. 6 shows the radiator array forming principle of the invention, and its field distribution.
Figure 7A:
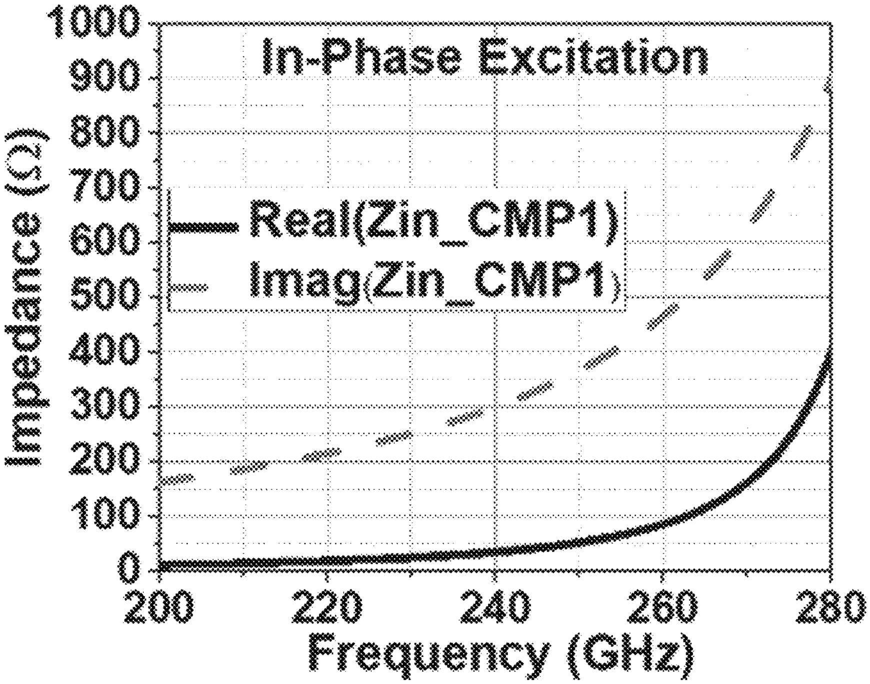
FIG. 7*a* shows real and imaginary parts of the input impedance of CMP1 in the radiator array of FIG. 6, under in-phase excitation.
Figure 7B:
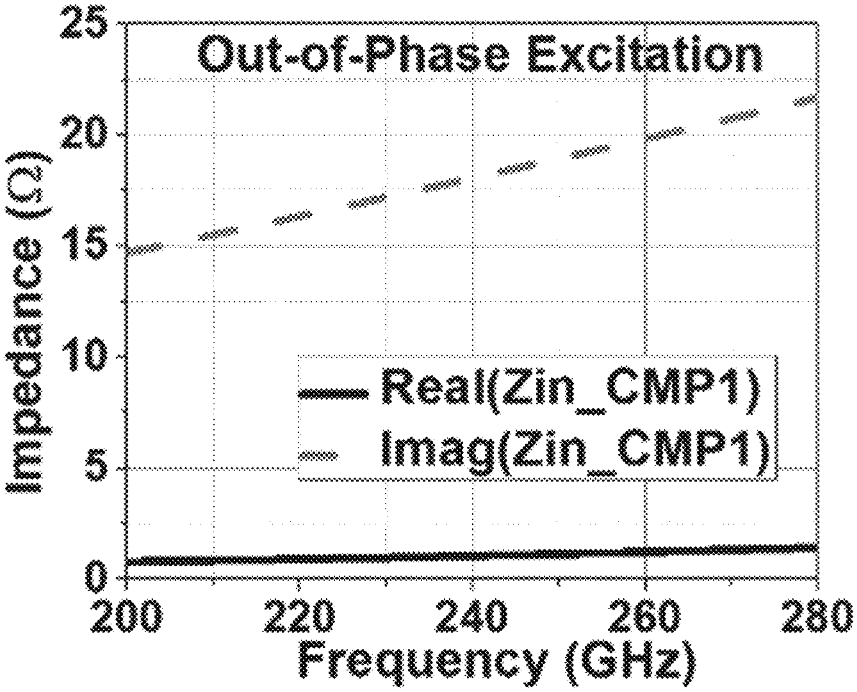
FIG. 7*b* shows real and imaginary parts of the input impedance of CMP1 in the radiator array of FIG. 6, under out-of-phase excitation.

In the following sections, a radiator array according to another embodiment of the invention is described, and the radiator array as shown in FIG. 6 has a 2×2 configuration of unit cells each having a structure similar to that shown in FIG. 1*a*. As such, in the radiator array on two different directions there are more than one unit cell. Each unit cell has four radiating elements, so the radiator array effectively (2×2 array in FIG. 6) has a 4×4 configuration of radiating elements. Exemplified by FIG. 6, one can see that the symmetric unit cell according to embodiments of the invention can be easily scaled up in 2D. In the horizontal direction, the adjacent cells are out-of-phase coupled at $f_0$ using the transmission line from the gate terminals of the transistor. The transmission line can only provide the required inductance for sustaining the oscillation under this mode, as the in-phase mode can only provide capacitance. The E-field distribution along the gate coupling transmission line is also shown in FIG. 6. Inside the unit cell, only the differential mode is supported between the two drain terminals of the transistor because in-phase excitation to the CMP1 will lead to considerable inductance at $f_0$, as the large impedance in FIG. 7*a* shows, which is far away from the oscillation condition. Under in-phase excitation, CMP1 can be treated as a coplanar waveguide short stub, the large characteristic impedance (originated from the wide slot) of the coplanar waveguide and the long electrical length result in the large input impedance shown in FIG. 7*a*. In contrast, the out-of-phase excitation to CMP1 will lead to the desired inductance for the optimum oscillation condition, as the impedance in FIG. 7*b* shows. The E-field magnitude along the transmission line between the drain terminals is shown in FIG. 6. It is noted that the magnitude is not scaled, and the phase is almost inverted from the gate to the drain terminal because the required phase is 160°, as explained above. Terminations in the horizontal direction are AC shorted transmission lines used to provide the necessary inductance for the gate terminals. The AC short termination is realized using a large metal plate in M4. Once the cells in the horizontal direction are correctly coupled at $f_0$, the phase of the excited E-field along the slots will be the same at $3f_0$. as shown in FIG. 6. Therefore, the third harmonics from all slots will coherently radiate into free space.

Figure 8A:
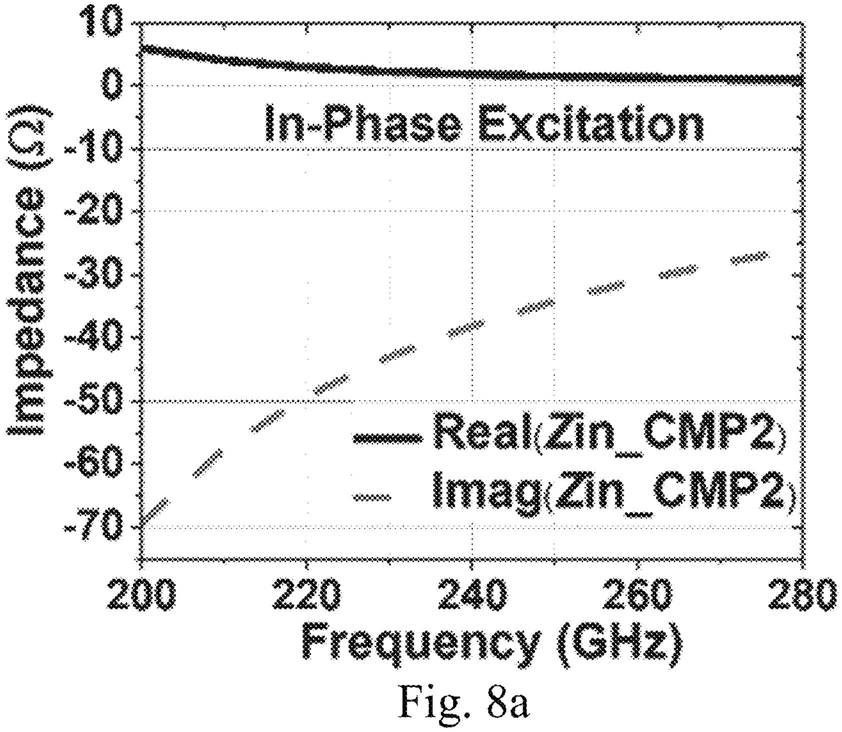
FIG. 8*a* shows real and imaginary parts of the input impedance of CMP2 in the radiator array of FIG. 6, under in-phase excitation.
Figure 8B:
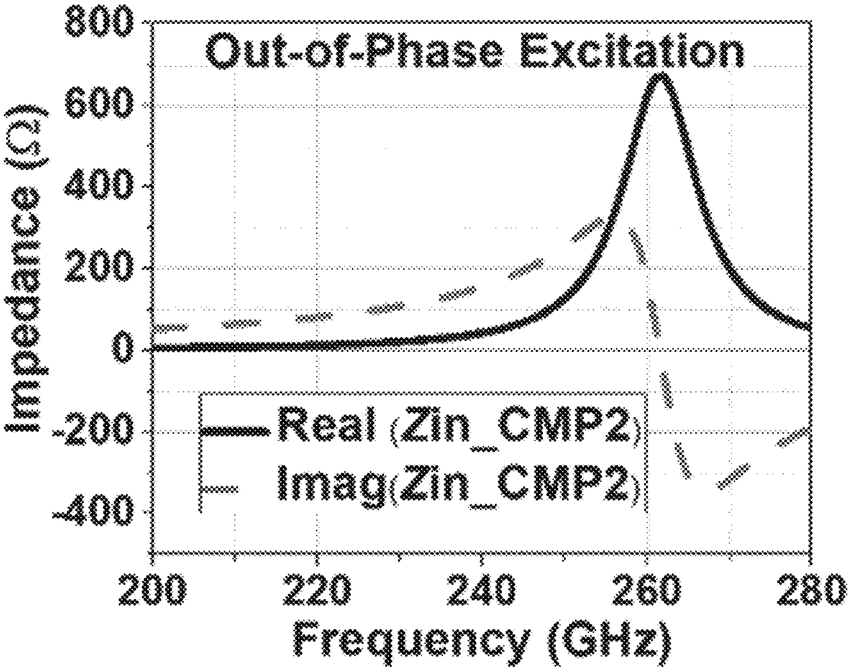
FIG. 8*b* shows real and imaginary parts of the input impedance of CMP2 in the radiator array of FIG. 6, under out-of-phase excitation.

In the vertical direction, the upper and lower parts inside the unit cell are proximally in-phase coupled from the gate terminals. If the adjacent cells are in-phase coupled, the third harmonics will radiate in phase for the whole array. This coupling is realized by the multi-functional CMP2, as depicted in FIG. 1*a*. The input impedances under in-phase and out-of-phase excitations between the adjacent vertical CMP2 are shown in FIGS. 8*a*-8*b*. Only the in-phase mode provides the required capacitance for the source terminal. The end of CMP2 is left open at the array's boundaries in the vertical direction, as it can be treated as the PMC.

Figure 9A:
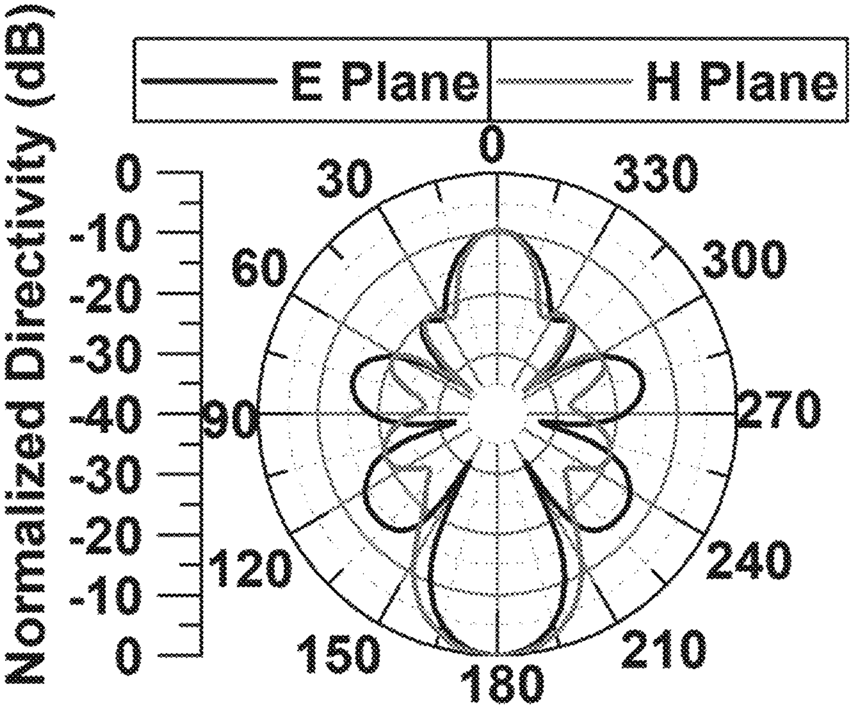
FIG. 9*a* illustrates the simulated radiation pattern of the 4×4 (16 unit cells) radiator array at 700 GHz.
Figure 9B:
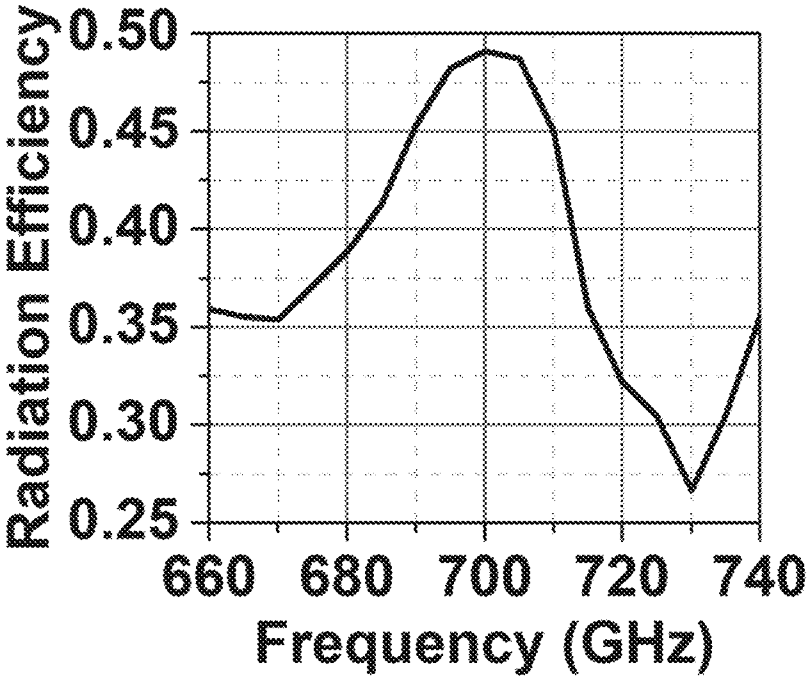
FIG. 9*b* illustrates the simulated radiation efficiency of the 4×4 radiator array (16 unit cells).

The element spacing in two dimensions needs to be properly chosen to obtain a good radiation pattern with a low side lobe from an antenna array. Generally, the optimum array element spacing should be $\sim\lambda_0/2$ if the waves directly radiate into the air. For the slot antenna array with a silicon substrate, the waves will penetrate the substrate first and then radiate to the air, leading the optimum spacing more compact. For better efficiency, the more compact spacing, the performance is better. In this design, a 2-D scalable design is aimed, which requires a compact unit cell in both directions. We have utilized multi-function components and tried to meet the requirement. The dimensions of the unit cells are labeled in FIG. 6 as an exemplary implementation. It can be found in the vertical direction (H plane), the slot antennas are closely placed as two oscillators are integrated within the unit cell in that direction. In the horizontal direction (E plane), the element spacing is larger, which may deteriorate the efficiency and radiation pattern a little bit, but that is unavoidable as we need enough space to layout the components. The simulated radiation pattern at 700 GHz and the radiation efficiency curve for the 4×4 array (16 unit cells) are shown in FIGS. 9*a* and 9*b*, respectively. It is found that the side-lobe level in the E plane is higher than the H plane due to the larger element spacing, but that is still acceptable.

Figure 10:
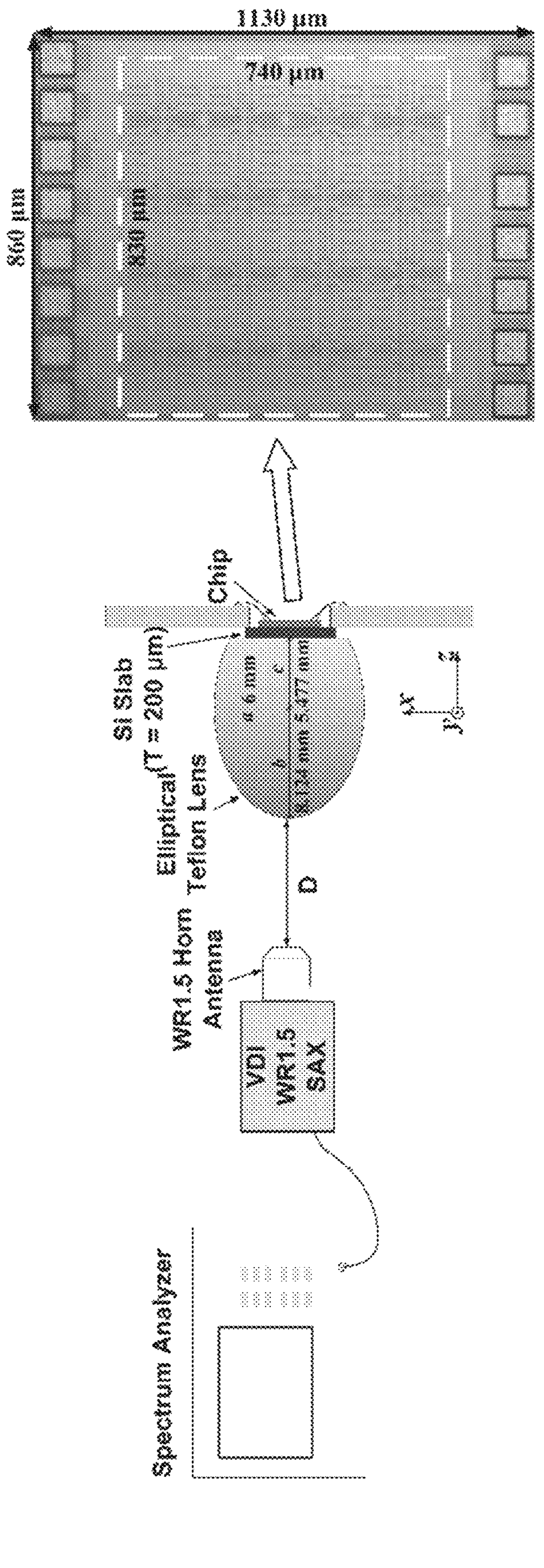
FIG. 10 shows the setup for output frequency measurement and chip packaging, as well as the micrograph of a chip fabricated according to the structure in FIG. 6.
Figure 11:
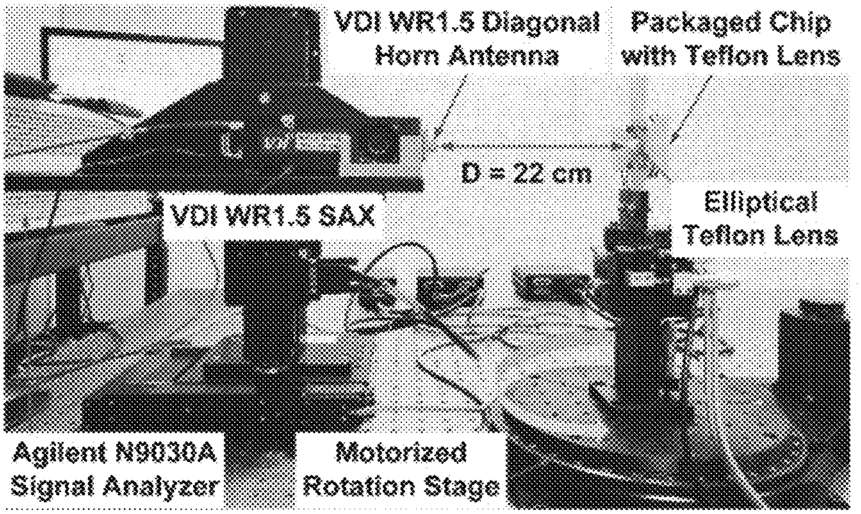
FIG. 11 is a photograph of a built setup for frequency, radiation pattern and radiated power measurement of the chip in FIG. 10.
Figure 12:
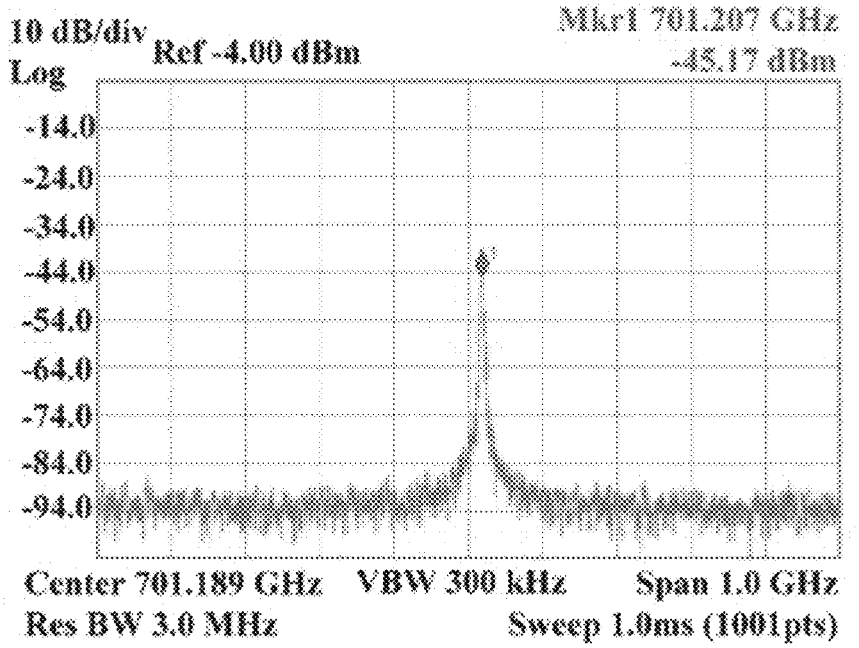
FIG. 12 illustrates measured output spectrum at 701.2 GHz of the chip in FIG. 10.
Figure 13:
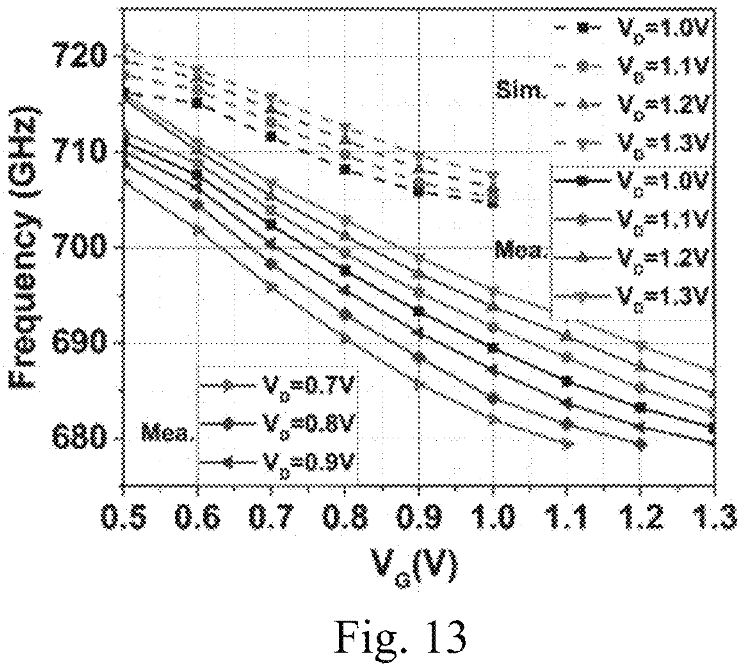
FIG. 13 illustrates simulated and measured output frequency under different bias voltages and supply voltages of the chip in FIG. 10.
Figure 14:
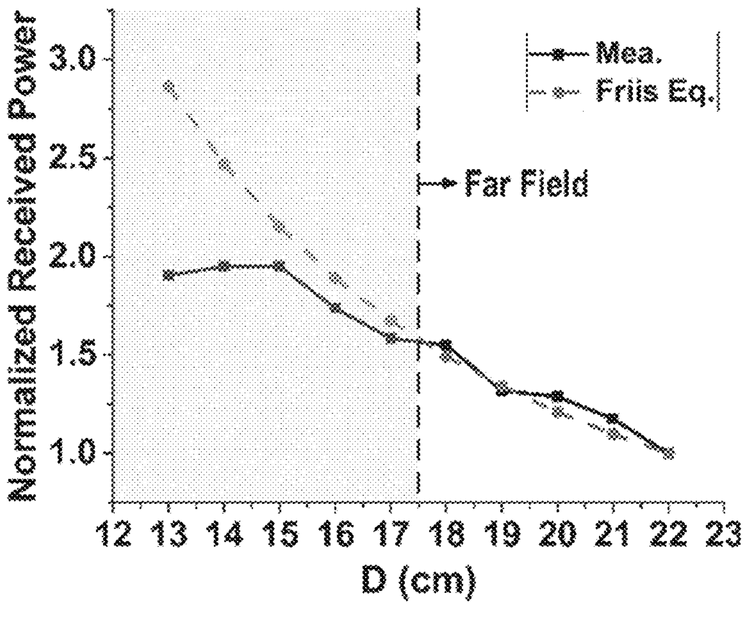
FIG. 14 illustrates normalized received power versus different distances and comparison with Friis transmission equation, for the chip in FIG. 10.
Figure 15A:
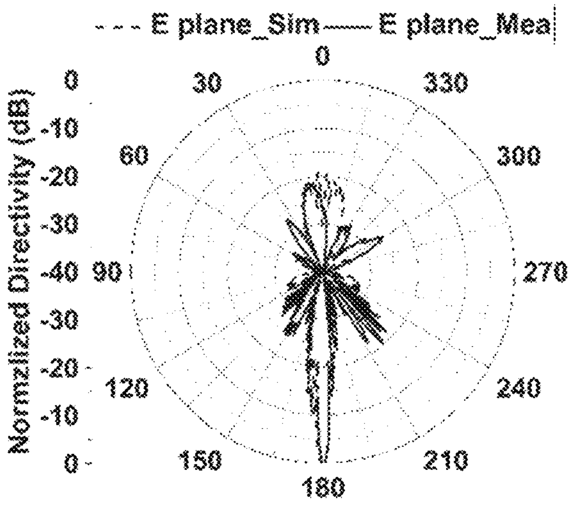
FIG. 15*a* shows simulated and measured radiation patterns in the E plane at 694 GHz with the lens, for the chip in FIG. 10.
Figure 15B:
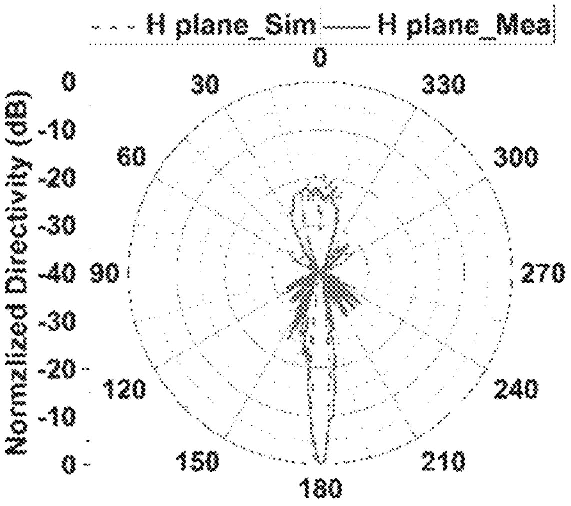
FIG. 15*b* shows simulated and measured radiation patterns in the H plane at 694 GHz with the lens, for the chip in FIG. 10.
Figure 16:
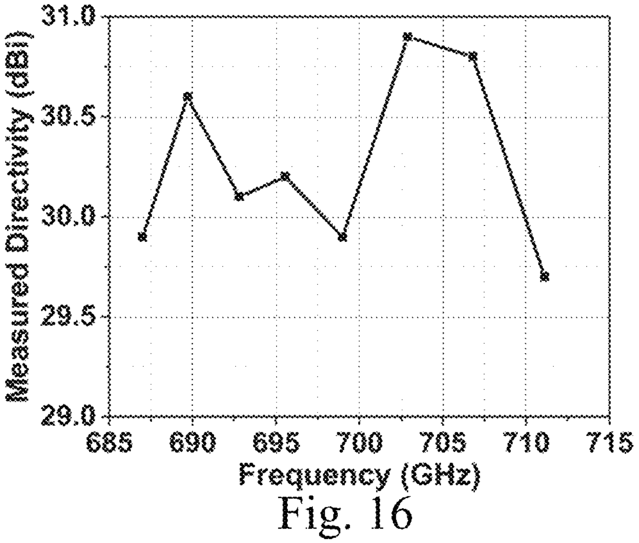
FIG. 16 illustrates measured directivity of the chip in FIG. 10 from 687 GHz to 711.1 GHz.

In this exemplary embodiment, the chip is fabricated using 65-nm CMOS technology. The micrograph of the chip is shown in FIG. 10. The core area of the chip is 0.83 mm×0.74 mm, and the total area, including DC pads, is 0.86 mm×1.13 mm. The chip is packaged following the configuration shown in FIG. 10. An undoped high-resistivity silicon slab is used to support the chip. The slab is glued to the PCB, and a hole is drilled in the center of the PCB. An elliptical Teflon (dielectric constant=2.1) lens is attached to the silicon slab to improve the directivity. The dimension of the lens is also labelled in FIG. 10. The total silicon substrate thickness should be chosen to be around $n\lambda_{si}/4$ (in is an odd number and is, is the wavelength in silicon at the designed frequency) to resolve wave reflections problem at the interface between high-dielectric silicon and low-dielectric Teflon. Therefore, waves can coherently combine and radiate to the Teflon lens. The silicon substrate thickness of the chip is 139 μm. For ease of packaging, an extra supporting silicon slab with 200 μm thickness is chosen so that the total thickness of the silicon is 339 μm which is around $11\lambda_{si}/4$ at 700 GHz. FIG. 10 also shows the setup for frequency measurement, and D is the distance between the radiator and the receiver. The radiated THz signal from the chip is received by a VDI WR1.5 diagonal horn antenna and down-converted by a VDI WR1.5 SAX. The output spectrum is shown in the Agilent PXA N9030A signal analyzer. The photograph of the measurement setup is shown in FIG. 11. The measured output frequency at 701.2 GHz is displayed in FIG. 12. By varying the bias voltage $V_G$ from 0.5 V to 1.3 V and supply voltage $V_D$ from 0.7 V to 1.3 V, the output frequencies vary from 679.4 GHz to 716.1 GHz, achieving a 5.26% tuning range as shown in FIG. 13. Compared with the simulated results, the measured frequency is ~10 GHz lower (~1.6% error), which may come from the inaccurate modelling of the transistor and the passive components and the coupling effects between the unit cells in the array. The far-field distance is firstly determined for radiation pattern and EIRP measurements. FIG. 14 shows the normalized received power by varying the distance D between the chip and the receiver. By comparing with the Friis transmission equation, one can find that for D larger than 17.5 cm, the received power agrees well with the Friis equation. In the following measurement, D=22 cm is used to ensure the far-field condition. The radiation patterns are measured utilizing the motorized rotation stage, as shown in FIG. 11. E- and H-plane radiation patterns are measured for 360° in 0.5° step. The simulated and measured radiation patterns in the E plane and H plane at 694 GHz are shown in FIG. 15*a* and 15*b*, respectively. A highly directive beam is observed at the backside, and some power also radiates to the front side due to the characteristic of the slot antenna. Radiation patterns for frequencies ranging from 687 GHz to 711.1 GHz are measured. The corresponding directivities are calculated and shown in FIG. 16; the average directivity within the band is 30.3 dBi.

Figure 17:
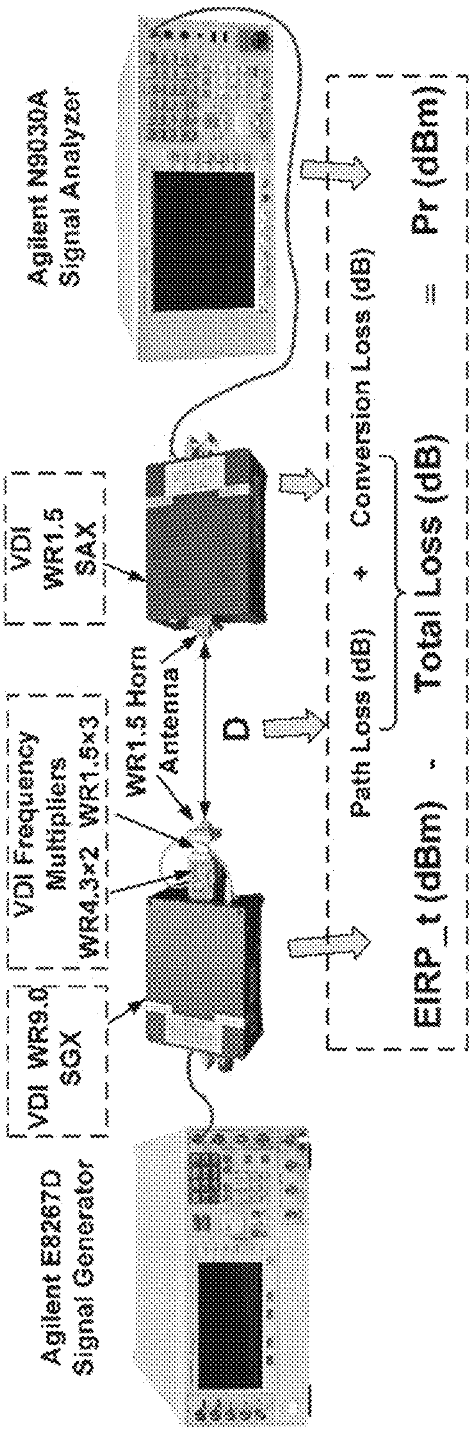
FIG. 17 illustrates a setup for path loss and conversion loss calibration of the VDI WR1.5 SAX in FIG. 11.
Figure 18:
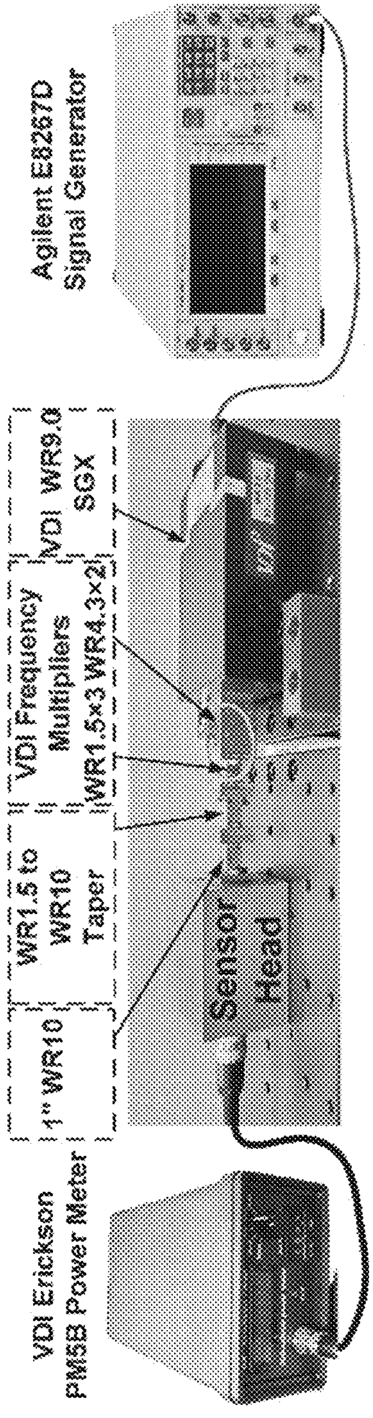
FIG. 18 illustrates a setup for power measurement of the VDI source according to an embodiment of the invention.

The total loss, including the path loss (D=22 cm) and conversion loss of VDI WR1.5 SAX should be calibrated to measure the output EIRP of the designed radiator. FIG. 17 shows the setup for total loss calibration, a VDI source in WR-1.5 band (500 GHz-750 GHz) is utilized. Low frequency from the signal generator (Agilent E8267D) is multiplied using a frequency multiplier chain composed of a VDI WR9.0 SGX and two VDI frequency multipliers (WR4.3×2 and WR1.5×3). The total loss in dB can be calculated by taking the difference of the EIRP of the VDI source and the measured received power obtained from the spectrum analyzer. The output EIRP of the VDI source is the sum of the output power and the gain of VDI WR1.5 diagonal horn antenna. The output power of VDI source is measured using the VDI Erickson PM5B power meter, as shown in FIG. 18. It is noted that the total loss of the WR1.5 to WR10 waveguide taper and the PM5B sensor head (WR10 waveguide) is around 0.95 dB within the measured band, while the gain of the diagonal horn antenna is around 25.3 dBi. With the calibrated total loss and the received power from the chip measured by the spectrum analyzer (with fixed distance D=22 cm), the output EIRP of the chip can be easily calculated by taking the sum of the received power and the calibrated total loss. The measured EIRP of the chip from 679.4 GHz to 716.1 GHz (by varying $V_G$) with different supply voltage $V_D$ is shown in FIG. 19*a*. FIG. 19*b* shows the corresponding DC power consumption. It can be observed that from 685 GHz to 700 GHz, EIRP higher than 25 dBm can be obtained and as $V_D$ increases, EIRP can be boosted. Under $V_D$=1.2 V, a peak EIRP of 27.3 dBm is measured at 694 GHz with 754-mW power consumption. The maximum EIRP of 27.8 dBm is measured at 699 GHz under $V_G$=0.9 V and $V_D$=1.3 V with 796-mW power consumption. The radiated power can be calculated by taking the difference between the measured EIRP and the measured directivity. With the measured EIRP in FIG. 19*a* and measured average directivity from FIG. 16, the radiated power $P_{rad}$ from 687 GHz to 711.1 GHz is calculated and shown in FIG. 19*c*. Under $V_D$=1.2 V, the peak radiated power is −3 dBm at 694 GHz, resulting in a 0.066% DC-to-THz efficiency. The maximum radiated power is −2.4 dBm at 699 GHz under 1.3-V supply voltage, resulting in a 0.072% DC-to-THz efficiency. It is noted that the fundamental power leakage is unavoidable for the radiators radiating the odd harmonics [1], [8] because the odd harmonics are under the same mode and will coherently radiate. Therefore, direct radiated power measurement using the power meter [4], [12] is not suitable. If the application requires high fundamental suppression, a THz frequency-selective surface (FSS) can be designed to filter the fundamental signal. FIG. 20*a* shows the measured phase noise at 694 GHz. At the 1-MHz offset, the measured phase noise is −73 dBc/Hz. FIG. 20*b* shows the measured phase noise at the 1-MHz offset from 687 GHz to 711.1 GHz.

TABLE II

COMPARISON WITH THE STATE-OF-THE-ART COHERENT SCALABLE RADIATORS IN SILICON

| Ref. | Radiating Element & Array Size | Frequency ($f_0$) (GHz) | Tuning Range (%) | EIRP (dBm) | $P_{rad}$ (dBm) | $P_{DC}$ (W) | DC-to-THz Efficiency (%) | Λ {X MHz} (dBc/Hz) | Area ($mm^2$) | $P_{rad}$/Area (mW/$mm^2$) | Technology |
|---|---|---|---|---|---|---|---|---|---|---|---|
| This Work | Diff. Excited Slot Ant. + Elliptical Teflon Lens | 694<br>(231.3) | 5.26 | 27.3[a]<br>(1.2V) | −3 | 0.754 | 0.066 | −73<br>(1 MHz) | 0.61/<br>0.97<br>Core/<br>Full | 0.82/<br>0.52<br>Core/<br>Full | 65-mm CMOS |
| | a = 6 mm<br>(8 × 4) | 679.4-<br>716.1 | | 27.8[b]<br>(1.3V) | −2.4 | 0.796 | 0.072 | 72.1<br>(1 MHz) | | 0.94/<br>0.59<br>Core/<br>Full | |
| ISSCC20 [1] | Slot Ant. + Si Lens (4 × 2) | 670<br>(223.3)<br>660.8-<br>676.6 | 2.4 | 7.4<br>(1.05V) | −16.1 | 0.0997 | 0.025 | −69<br>(1 MHz) | 0.86 | 0.03 | 40-nm CMOS |
| ISSCC20 [2] | Harmonic-Selective Ant. + Si Lens (6 × 6) | 586.7<br>(146.7) | 0.7 | 24.1<br>(0.9V) | 0.1 | 1.278 | 0.08 | −82<br>(1 MHz) | 0.68<br>Core | 1.50<br>Core | 40-nm CMOS |
| IMS15 [3] | Diff. Slot Ant. + Si Lens (2 × 4) | 550<br>(183.3)<br>540-550 | 1.8 | 24.4<br>(1.0V) | −9.0 | 1.3 | 0.01 | −79.3<br>(1 MHz) | 2.16 | 0.06 | 65-nm CMOS |
| JSSC20 [4] | Slot Ant. + Si Lens (25), $R_{lens}$ = 5 mm | 459<br>(114.8) | 8.9 | 14.7<br>(1.2V) | −2.1 | 1.47 | 0.042 | −100.6<br>(10 MHz) | 3.94 | 0.16 | 65-nm CMOS |
| | $R_{lens}$ = 12.5 mm | 438.4-<br>479.1 | | 19.3<br>(1.2V) | −1.8 | | 0.045 | | | 0.17 | |
| JSSC22 [5] | Opt. Slot Ant. Array (4 × 4), w/o Lens | 450<br>(225)<br>444-<br>465 | 4.6 | 8.8<br>(1.2 V) | −2.4 | 0.373 | 0.16 | −76.4<br>(1 MHz) | 0.55/<br>1.56<br>Core/<br>Full | 1.05/<br>0.37<br>Core/<br>Full | 65-nm CMOS |
| | w/ Teflon Lens a = 6 mm | | | 28.2<br>(1.2 V) | −4.1 | 0.346 | 0.11 | | | 0.7/<br>0.25<br>Core/<br>Full | |
| ISSCC20 [6] | Patch Ant. (4 × 4) | 416(69.3)<br>412-419 | 1.7 | 14<br>(1.1V) | −3 | 1.45 | 0.034 | −88<br>(1 MHz) | 4.1 | 0.12 | 65-nm CMOS |
| JSSC15 [7] | Patch Ant. (4 × 4) | 338(84.5) | 2.1 | 17.1<br>(1.2V) | −0.9 | 1.54 | 0.053 | −93<br>(1 MHz) | 3.9 | 0.21 | 65-nm CMOS |
| TMTT20 [8] | Multiport DRA (5 × 6) | 280(93.3)<br>275-287 | 4.1 | 24.1<br>(1.2V) | 9 | 0.421 | 1.88 | N/A | 2.1 | 3.78 | 65-nm CMOS |
| JSSC18 [9] | Slot Ant. + Si Lens (6 × 7) | 1010<br>(252.5)<br>1011.2-<br>1016 | 0.5 | 13.1<br>(1.8V) | −10.9 | 1.1 | 0.007 | N/A | 1 | 0.08 | 130-nm SiGe |
| JSSC19 [10] | Patch Ant. (2 × 2) | 344(86)<br>318-370 | 15.1 | 4.9<br>(1.5V) | −6.8 | 0.45 | 0.046 | −93.1<br>(10 MHz) | 1.2 | 0.17 | 130-nm SiGe |
| TMTT18 [11] | Patch Ant. (1 × 4) | 342(85.5)<br>332.5-<br>352.8 | 5.9 | 1.2<br>(1.8V) | −10.5 | 0.425 | 0.021 | −98.2<br>(10 MHz) | 1.33 | 0.07 | 130-nm SiGe |
| JSSC15 [12] | Fold Slot (4 × 4), w/o Lens | 317<br>(158.5) | N/A | 13.9 | 0.9 | 0.61 | 0.2 | −79<br>(1 MHz) | 2.1 | 0.59 | 130-nm SiGe |
| | Si Lens | | | 22.5<br>(2.15V) | 5.2 | | 0.54 | | | 1.58 | |

[a]@694 GHz
[b]@699 GHz

In summary, the above exemplary embodiment provides a compact and symmetric unit cell that not only oscillates with a high $f_{osc}/f_{max}$ ratio but is also easy to scale to form a large, coupled oscillator array with proper coupling mode to radiate the third harmonics coherently. A chip prototype is designed, fabricated, and measured, showing the high output power capability at frequencies around 700 GHz in CMOS, proving the proposed unit cell can scale to at least a 4×4 array (8×4 radiating slot elements). High EIRP is also achieved by adding a low-cost elliptical Teflon lens instead of a more expensive silicon lens. Table 11 compares the measured performance of the prototype (referred to as "This Work" in Table II and FIG. 21) with other state-of-the-art coherent, scalable THz radiators. FIG. 21 shows graphically the output power of the silicon-based coherent scalable radiators in This Work as compared to the state of art radiators. The exemplary embodiments above achieve the best performance in terms of the tuning range, radiated power, EIRP, DC-to-THz efficiency, and radiated power per area for frequencies beyond 600 GHz. The design in the exemplary embodiments above can be improved by designing a structure to better match the optimum third harmonic impedance for a higher radiated power and efficiency.

The design in the exemplary embodiments above is implemented using the transmission lines. Therefore, it is also easy to apply to high-speed and high-power HI-V semiconductor technology, which is useful in filling the terahertz gap for many promising applications.

The exemplary embodiments are thus fully described. Although the description referred to particular embodiments, it will be clear to one skilled in the art that the invention may be practiced with variation of these specific details. Hence this invention should not be construed as limited to the embodiments set forth herein.

While the embodiments have been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the exemplary embodiments described above, a unit cell of the radiator array has four radiating elements in a two-fold symmetry, and the radiator array in FIG. 6 has four unit cells. However, it is clear that the invention is not limited by the number of unit cells in a radiator array. Rather, the radiator array is two-dimensional scalable, and the number of unit cells can be more than two in each direction according to practical applications.

REFERENCES

Each of the following references (and associated appendices and/or supplements) is expressly incorporated herein by reference in its entirety:

[1] G. Guimaraes and P. Reynaert, "A 670-GHz 4×2 oscillator-radiator Array Achieving 7.4-dBm EIRP in 40-nm CMOS," *IEEE. J. Solid-State Circuits*, vol. 56, no. 11, pp. 3399-3411, November 2021.

[2] K. Guo and P. Reynaert, "A 0.59 THz beam-steerable coherent radiator array with 1 mW radiated power and 24.1 dBm EIRP in 40 nm CMOS," in *IEEE Int. Solid-State Circuits Conf.* (*ISSCC*) *Dig. Tech. Papers*, San Francisco, Calif., USA, February 2020, pp. 442-444.

[3] Y. Zhao et al., "A 0.54-0.55 THz 2×4 coherent source array with EIRP of 24.4 dBm in 65 nm CMOS technology," in *IEEE MTT-S Int. Microw. Symp. Dig.*, Phoenix, Ariz., USA, May 2015, pp. 1-3.

[4] H. Jalili and O. Momeni, "A 0.46-THz 25-element scalable and wideband radiator array with optimized lens integration in 65-nm CMOS," *IEEE J. Solid-State Circuits*, vol. 55, no. 9, pp. 2387-2400, September 2020.

[5] L. Gao and C. H. Chan, "A 0.45-THz 2-D scalable radiator array with 28.2-dBm EIRP using an elliptical Teflon lens," *IEEE J. Solid-State Circuits*, vol. 57, no. 2, pp. 400412, February 2022.

[6] H. Saeidi, S. Venkatesh, C. R. Chappidi, T. Sharma, C. Zhu, and K. Sengupta, "A 4×4 distributed multi-layer oscillator network for harmonic injection and THz beamforming with 14 dBm EIRP at 416 GHz in a lens less 65 nm CMOS IC," in *IEEE Int. Solid-State Circuits Conf* (*ISSCC*) *Dig. Tech. Papers*, San Francisco, Calif., USA, February 2020, pp. 256-258.

[7] Y. Tousi and E. Afshari, "A high-power and scalable 2-D phased array for terahertz CMOS integrated systems," *IEEE J. Solid-State Circuits*, vol. 50, no. 2, pp. 597-609, February 2015.

[8] N. Buadana, S. Jameson, and E. Socher, "A multiport chip-scale dielectric resonator antenna for CMOS THz transmitters," *IEEE Trans. Microw. Theory Techn.*, vol. 68, no. 9, pp. 3621-3632, September 2020.

[9] Z. Hu, M. Kaynak, and R. Han, "High-power radiation at 1 THz in silicon: A fully scalable array using a multi-functional radiating mesh structure," *IEEE J. Solid-State Circuits*, vol. 53, no. 5, pp. 1313-1327, May 2018.

[10] H. Jalili and O. Momeni, "A 0.34-THz wideband wide-angle 2-D steering phased array in 0.13-μm SiGe BiCMOS," *IEEE J. Solid-State Circuits*, vol. 54, no. 9, pp. 2449-2461, September 2019.

[11] H. Jalili and O. Momeni, "A standing-wave architecture for scalable and wideband millimeter-wave and terahertz coherent radiator arrays," *IEEE Trans. Microw. Theory Techn.*, vol. 66, no. 3, pp. 1597-1609, March 2018.

[12] R. Han et al., "A SiGe terahertz heterodyne imaging transmitter with 3.3 mW radiated power and fully-integrated phase-locked loop," *IEEE. J. Solid-State Circuits*, vol. 50, no. 12, pp. 2935-2947, December 2015.

What is claimed is:

1. A device for signal generation comprising coupled unit cells, each of the unit cells comprising two oscillators that are coupled in phase; each said oscillator operating at a fundamental frequency; each said oscillator further comprising a slot structure;

wherein the slot structures serve as, at a third harmonic of the fundamental frequency, a slot antenna radiating a third harmonic power.

2. The device of claim 1, wherein the slot structures are each substantially perpendicular to a virtual boundary line between the two oscillators.

3. The device of claim 1, wherein the oscillators each contains two identical radiating elements separated and connected by the slot structure of the oscillator; the device comprising four said identical radiating elements.

4. The device of claim 3, wherein the radiating element comprising a transistor; and a meander structure connected to the transistor; the transistor further connected to the slot structure of the radiating element.

5. The device of claim 4, wherein an end of the meander structure is open-ended.

6. The device of claim 4, wherein the meander structure has a substantially "S" shape.

7. The device of claim 4, wherein a drain of the transistor connects to the slot structure of the radiating element; a source of the transistor connecting to the meander structure of the radiating element.

8. The device of claim 7, wherein a gate of the transistor connects to a transmission line of the radiating element that is substantially parallel to a virtual boundary line between the two oscillators of each of the unit cells.

9. The device of claim 1, further comprising a plurality of said unit cells along each one of two different directions.

10. The device of claim 9, wherein each of the plurality of unit cells is horizontally coupled out-of-phase and vertically in-phase with adjacent cells at the fundamental frequency.

11. The device of claim 9, further comprises an elliptical lens attached at a backside of the device.

* * * * *